(12) United States Patent
Taguchi et al.

(10) Patent No.: US 7,622,747 B2
(45) Date of Patent: Nov. 24, 2009

(54) LIGHT EMITTING DEVICE AND MANUFACTURING METHOD THEREOF

(75) Inventors: Yuichi Taguchi, Nagano (JP); Hideaki Sakaguchi, Nagano (JP); Naoyuki Koizumi, Nagano (JP); Mitsutoshi Higashi, Nagano (JP); Akinori Shiraishi, Nagano (JP); Masahiro Sunohara, Nagano (JP); Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 448 days.

(21) Appl. No.: 11/645,876

(22) Filed: Dec. 27, 2006

(65) Prior Publication Data

US 2007/0158674 A1     Jul. 12, 2007

(30) Foreign Application Priority Data

Jan. 6, 2006     (JP)     ............................... 2006-001801

(51) Int. Cl.
*H01L 33/00*     (2006.01)

(52) U.S. Cl. .......................................... 257/98; 257/99

(58) Field of Classification Search ........... 257/89–103, 257/E33.072
See application file for complete search history.

(56) References Cited

U.S. PATENT DOCUMENTS

2006/0147746 A1* 7/2006 Wakako et al. ............... 428/627
2008/0023713 A1* 1/2008 Maeda et al. .................. 257/98

FOREIGN PATENT DOCUMENTS

JP          11-177136          7/1999

* cited by examiner

*Primary Examiner*—Cuong Q Nguyen
(74) *Attorney, Agent, or Firm*—Ladas & Parry LLP

(57) ABSTRACT

A light emitting device is disclosed. The light emitting device includes a light emitting element (15), and a light emitting element container (11) having a concave section (20) for containing the light emitting element (15). The concave section (20) includes a side surface (20A) and a bottom surface (20B) almost orthogonal to the side surface (20A). The light emitting device further includes a conductive paste layer (17) formed of a conductive paste in which metal particles are dispersed in a solution, and the conductive paste layer (17) includes a slanting surface (17A) on the side surface (20A) and the bottom surface (20B).

2 Claims, 22 Drawing Sheets

LIGHT EMITTING DEVICE AND MANUFACTURING METHOD THEREOF

BACKGROUND OF THE INVENTION

1. Field of the Invention

The present invention generally relates to a light emitting device having a reflector which reflects light emitted from a light emitting element and a manufacturing method thereof.

2. Description of the Related Art

Conventionally, as shown FIG. 1, there is a light emitting device having a reflector which reflects light emitted from a light emitting element such as an LED (light emitting diode).

FIG. 1 is a schematic cross-sectional view of a light emitting device.

As shown in FIG. 1, a light emitting device 100 provides a light emitting element container 101, wiring patterns 102 and 103, a light emitting element 105, and a metal film 106. The light emitting element container 101 provides a concave section 108 for containing the light emitting element 105. The concave section 108 has a shape whose opening part is gradually widened from a bottom surface 108B to the upper region. A side surface 108A of the concave section 108 is slanted. The concave section 108 is formed by etching the material of the light emitting element container 1011. The material of the light emitting element container 101 is, for example, silicon or glass.

The wiring patterns 102 and 103 are formed to penetrate the light emitting element container 101. The light emitting element 105 having electrodes 111 and 112 is contained in the concave section 108. The electrode 111 is electrically connected to the wiring pattern 103, and the electrode 112 is electrically connected to the wiring pattern 102 via a wire 114.

The metal film 106 is formed to cover the side surface 108A of the concave section 108. The metal film 106 is a reflector which reflects light emitted from the light emitting element 105. The metal film 106 is formed by, for example, plating (refer to Patent Document 1).

[Patent Document 1] Japanese Laid-Open Patent Application No. 11-177136 (Japanese Patent No. 3329716)

However, since the side surface 180A needs to have a precise angle with the bottom surface 108B, it is difficult to form the concave section 108 by etching a material such as silicon or glass. Even if the concave section 108 is formed by the etching, the cost of the light emitting device 100 is increased.

In addition, when the metal film 106 is formed by plating on the side surface 108A of the concave section 108, it is necessary to form a resist film before the plating and to remove the resist film after the plating. Consequently, the cost of the light emitting device 100 is increased.

SUMMARY OF THE INVENTION

In a preferred embodiment of the present invention, there is provided a light emitting device and a manufacturing method thereof in which cost can be decreased.

Features and advantages of the present invention are set forth in the description which follows, and in part will become apparent from the description and the accompanying drawings, or may be learned by practice of the invention according to the teachings provided in the description. Features and advantages of the present invention may be realized and attained by a light emitting device and a manufacturing method thereof particularly pointed out in the specification in such full, clear, concise, and exact terms as to enable a person having ordinary skill in the art to practice the invention.

According to one aspect of the present invention, there is provided a light emitting device. The light emitting device includes a light emitting element and a light emitting element container having a concave section for containing the light emitting element. The concave section includes a side surface and a bottom surface almost orthogonal to the side surface. The light emitting device further includes a conductive paste layer formed of a conductive paste in which metal particles are dispersed in a solution, and the conductive paste layer includes a slanting surface on the side surface and the bottom surface.

Since the conductive paste layer having the slanting surface is formed on the side surface and the bottom surface of the concave section, it is not necessary to form a concave section which needs precise dimensions in the light emitting element container. Therefore, the cost of the light emitting device can be decreased.

According to another aspect of the present invention, there is provided a manufacturing method of a light emitting device that includes a light emitting element, a light emitting element container having a concave section for containing the light emitting element, and wiring patterns. The concave section includes a side surface and a bottom surface almost orthogonal to the side surface. The manufacturing method includes a conductive paste layer forming step that forms a conductive paste layer with a conductive paste in which metal particles are dispersed in a solution so as to form a slanting surface of the conductive paste layer on the side surface and the bottom surface.

Since the manufacturing method of the light emitting device includes the conductive paste layer forming step and the conductive paste layer can be easily formed by a spray coating method, an inkjet method, or a dispensing method, the manufacturing cost can be low.

According to an embodiment of the present invention, a reflector for reflecting light emitted from a light emitting element can be easily formed by a conductive paste layer. Therefore, the cost of the light emitting device and the manufacturing cost of the light emitting device can be decreased.

Features and advantages of the present invention will become apparent from the following detailed description when read in conjunction with the accompanying drawings.

DESCRIPTION OF THE PREFERRED EMBODIMENTS

In the following, embodiments of the present invention are described with reference to the accompanying drawings.

First Embodiment

Figure 2:
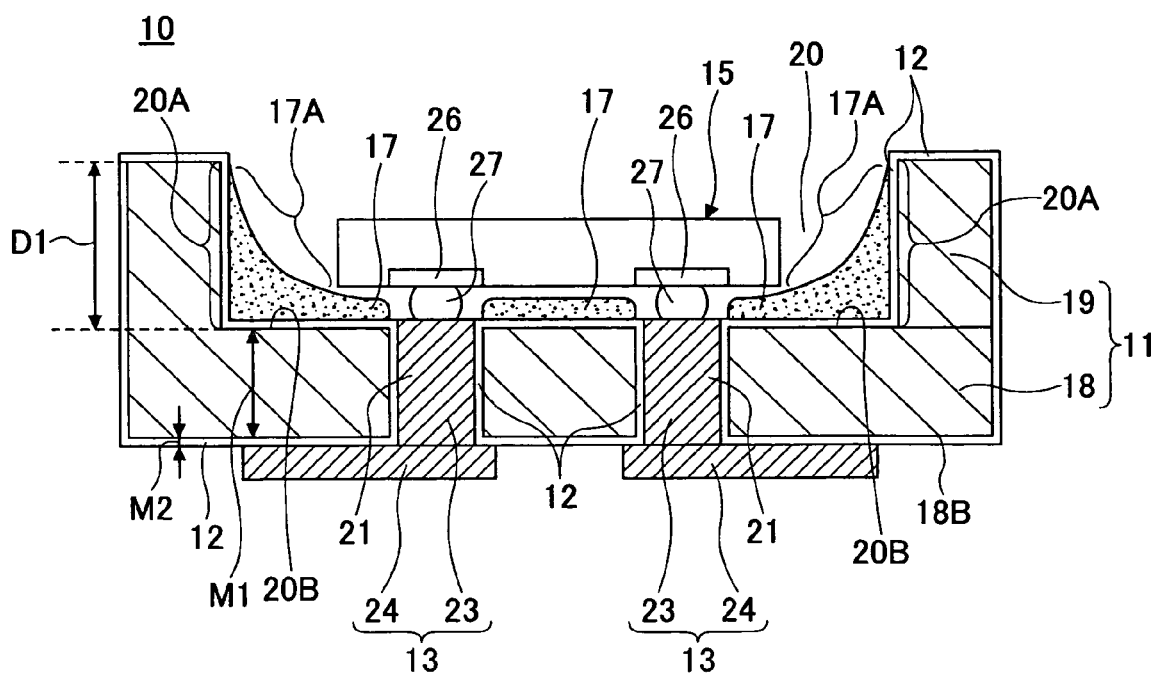
FIG. 2 is a schematic cross-sectional view of a light emitting device according to a first embodiment of the present invention.

FIG. 2 is a schematic cross-sectional view of a light emitting device according to a first embodiment of the present invention.

Referring to FIG. 2, a light emitting device 10 according to the first embodiment of the present invention is described. The light emitting device 10 includes a light emitting element container 11, an insulation film 12, wiring patterns 13, a light emitting element 15, and a conductive paste layer 17.

The light emitting element container 11 includes a plate section 18, a frame section 19, and a concave section 20. The plate section 18 is integrally formed with the frame section 19 to hold the frame section 19. The plate section 18 provides plural through holes 21. The thickness M1 of the plate section 18 is, for example, 200 μm. The frame section 19 is formed on the plate section 18.

The light emitting element 15 is contained in the concave section 20. The concave section 20 is formed of a side surface 20A (inner wall of the frame section 19) and a bottom surface 20B (upper surface of the plate section 18) almost orthogonal to the side surface 20A. The shape of the concave section 20 can be a cylinder or a square hole; however, the shape is not limited to the above. The concave section 20 is formed by applying anisotropic etching to a material of the light emitting element container 11. The depth D1 of the concave section 20 is, for example, 200 μm. The material of the light emitting element container 11 is, for example, silicon or glass.

The insulation film 12 is formed to cover the surface of the light emitting element container 11 including the surfaces of the plural through holes 21. The insulation film 12 insulates between the light emitting element container 11 and the wiring patterns 13, and between the light emitting element container 11 and the conductive paste layer 17. The insulation film 12 is formed of, for example, an oxide film. The thickness M2 of the insulation film 12 is, for example, 1 μm.

The wiring pattern 13 provides via wiring 23 and wiring 24. The via wiring 23 is formed in the through hole 21 on whose surface the insulation film 12 is formed. The upper surface of the via wiring 23 is electrically connected to the light emitting element 15 and the lower surface thereof is electrically connected to the wiring 24. The material of the via wiring 23 is a conductive metal, for example, Cu.

The wiring 24 is electrically connected to the lower surface of the via wiring 23 and is extended on a lower surface 18B of the plate section 18 on whose surface the insulation film 12 is formed. Therefore, the wiring 24 is electrically connected to the light emitting element 15 via the via wiring 23. The wirings 24 function as terminals of the light emitting device 10 which terminals are connected to an external device. The material of the wiring 24 is a conductive metal, for example, a Ni/Au stacked film in which a Ni layer and an Au layer are stacked in this order as viewed from the inside.

The light emitting element 15 is contained in the concave section 20 of the light emitting element container 11. The light emitting element 15 emits a predetermined color light and provides electrodes 26. Each electrode 26 is electrically connected to the via wiring 23 via a bump 27. With this, the light emitting element 15 is electrically connected to the wiring patterns 13. As the light emitting element 15, an LED can be used.

The conductive paste layer 17 is formed of a conductive paste in which metal particles are dispersed in a solution, and is adhered on the side surface 20A and the bottom surface 20B including the center part of the concave section 20 in conditions where the via wirings 23 are exposed so that the conductive paste layer 17 does not contact the wiring patterns 13. The conductive paste layer 17 formed on the side surface 20A and the bottom surface 20B of the concave section 20 forms a slanting surface 17A. The slanting surface 17A of the conductive paste layer 17 reflects light emitted from the light emitting element 15. With this, the light emitting efficiency of the light emitting device 10 can be increased.

Figure 1:
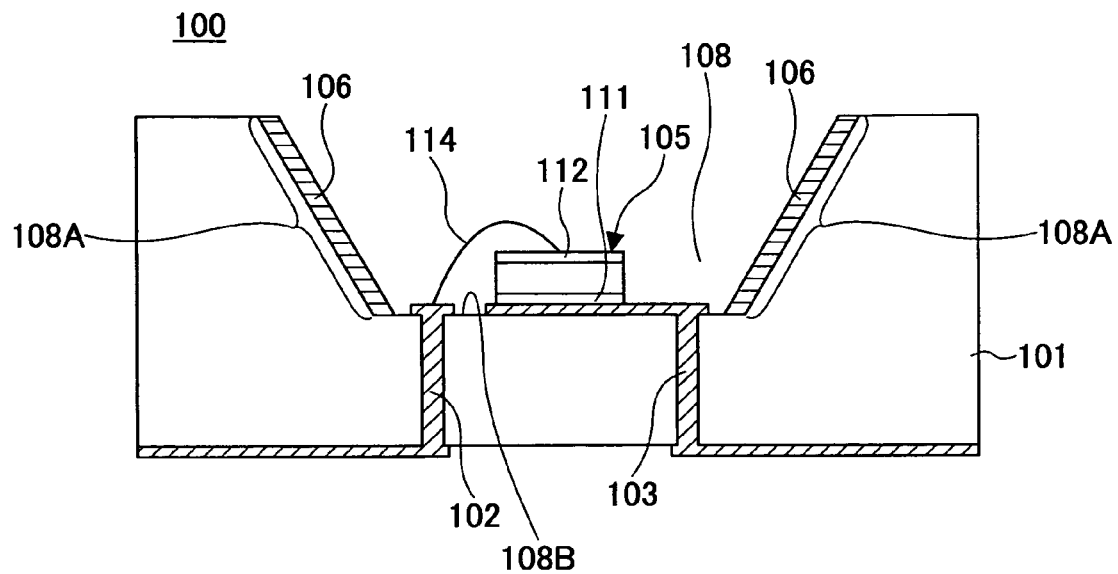
FIG. 1 is a schematic cross-sectional view of a light emitting device.

As described above, the slanting surface 17A of the conductive paste layer 17 is formed on the side surface 20A and the bottom surface 20B of the concave section 20; therefore, the concave section 108 having the metal film 106 shown in FIG. 1, which concave section 108 is difficult to manufacture due to the precise dimensions, is not needed. Therefore, the light emitting device 10 can be manufactured at low cost.

Next, the conductive paste of which the conductive paste layer 17 is formed is described in detail. As described above, the conductive paste is formed by dispersing metal particles in a solution. As the solution, water, an organic solvent, or a material in which glycerin is added to the water or the organic solvent can be used. As the organic solvent, for example, alcohol, ether, xylene, or toluene can be used.

As the metal particles in the conductive paste, metal particles formed of one or more metal of, for example, Au, Ag, Al, Ni, Pd, and Pt can be used.

By dispersing metal particles of one or more of Au, Ag, Al, Ni, Pd, and Pt in the solution, the conductive paste layer 17 can be used as a reflector for reflecting light emitted from the light emitting element 15.

The average particle diameter of the metal particles is, for example, 10 nm to 30 nm. The volume ratio of the metal particles (=the volume of the metal particles/the volume of the conductive paste) is, for example, 10 wt % to 60 wt %.

The conductive paste layer 17 can be formed by a spray coating method, an inkjet method, or a dispensing method.

The conductive paste for the conductive paste layer 17 has low viscosity. The viscosity of the conductive paste is, for example, 1 mPa·s to 200 mPa·s. When the viscosity of the conductive paste is more than 200 mPa·s, the spray coating method cannot be used. When the viscosity of the conductive paste is less than 1 mPa·s, it is difficult to manufacture the conductive paste layer 17 due to a limitation of the manufacturing technology. When the conductive paste layer 17 is formed by the inkjet method, it is preferable that the viscosity of the conductive paste be 5 mPa·s to 30 mPa·s.

As described above, according to the present embodiment, the conductive paste layer 17 having the slanting surface 17A is formed on the side surface 20A and the bottom surface 20B of the concave section 20 and the slanting surface 17A operates as the reflector of light emitted from the light emitting element 15. That is, the metal film 106 shown in FIG. 1 is not needed. Therefore, the cost of the light emitting device 10 can be decreased.

Next, referring to the drawings, a manufacturing method of the light emitting device 10 according to the first embodiment of the present invention is described.

FIGS. 3 through 20 are schematic cross-sectional views showing processes for manufacturing the light emitting device 10 according to the first embodiment of the present invention.

Figure 3:
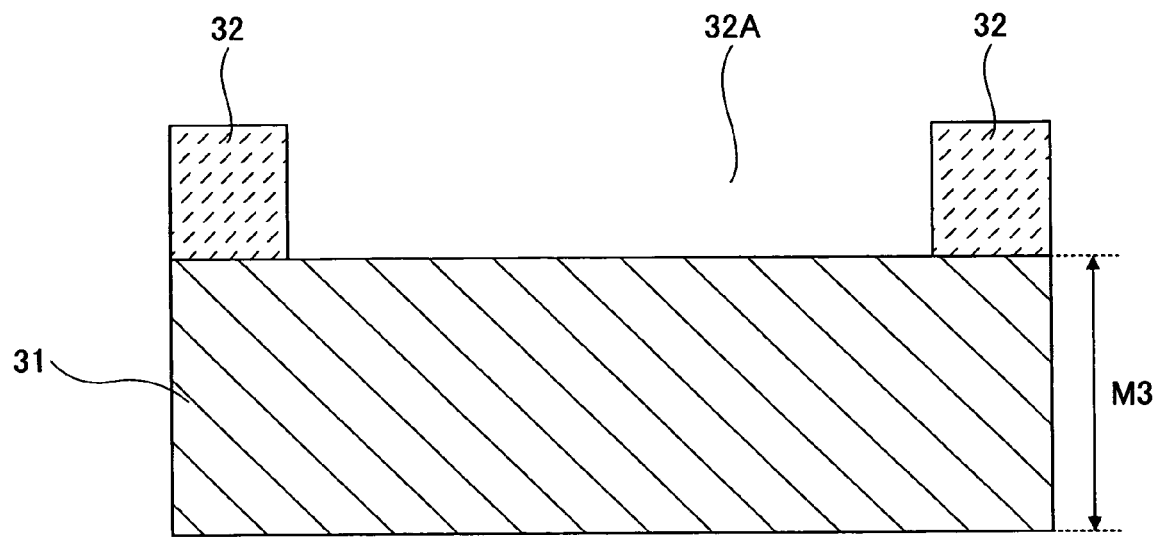
FIGS. 3 through 20 are schematic cross-sectional views showing processes for manufacturing the light emitting device according to the first embodiment of the present invention.

First, in a process shown in FIG. 3, a resist film 32 is formed on a substrate 31 so that an opening section 32A is formed. The opening section 32A corresponds to the position where the concave section 20 is to be formed, and the substrate 31 is exposed at the position of the opening section 32A. The material of the substrate 31 is, for example, silicon or glass. The thickness M3 of the substrate 31 is, for example, 400 μm. The material of the resist film 32 is, for example, a dry film resist.

Figure 4:
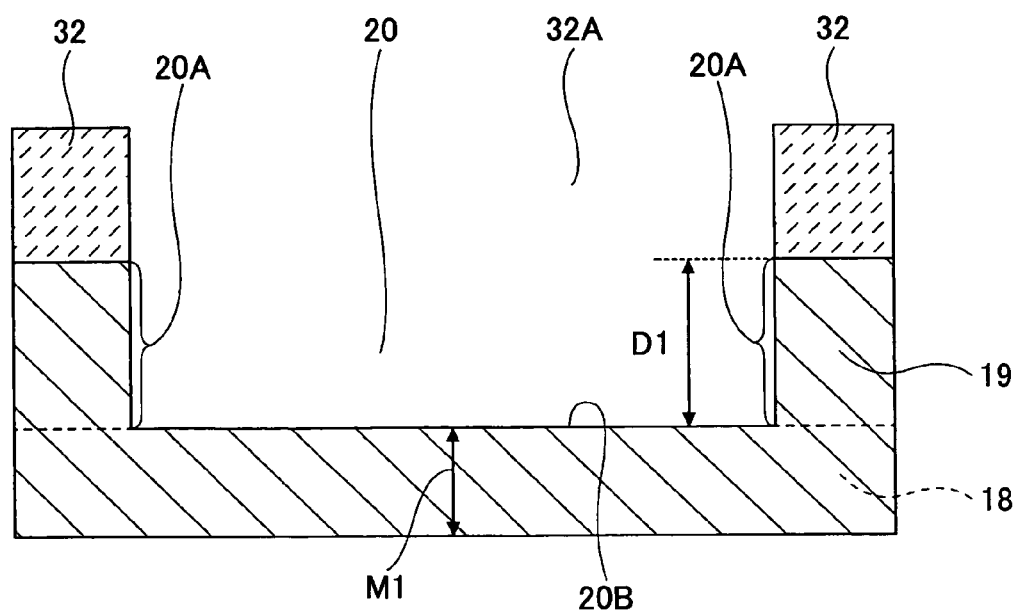

Next, in a process shown in FIG. 4, the concave section 20 is formed by applying anisotropic etching to the substrate 31 by using the resist film 32 as a mask. With this, a structure corresponding to the plate section 18 in which the through holes 21 are not formed and the frame section 19 is formed. The side surface 20A and the bottom surface 20B of the concave section 20 are almost orthogonal to each other. As described above, the thickness M1 of the plate section 18 can be, for example 200 μm, and the depth D1 of the concave section 20 can be, for example, 200 μm. As for the anisotropic etching, dry etching can be used.

Figure 5:
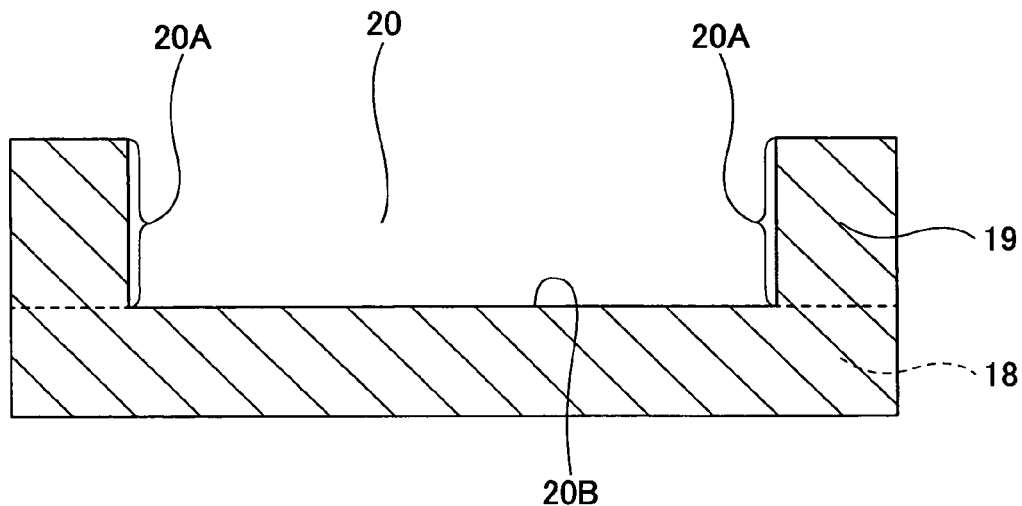
Figure 6:
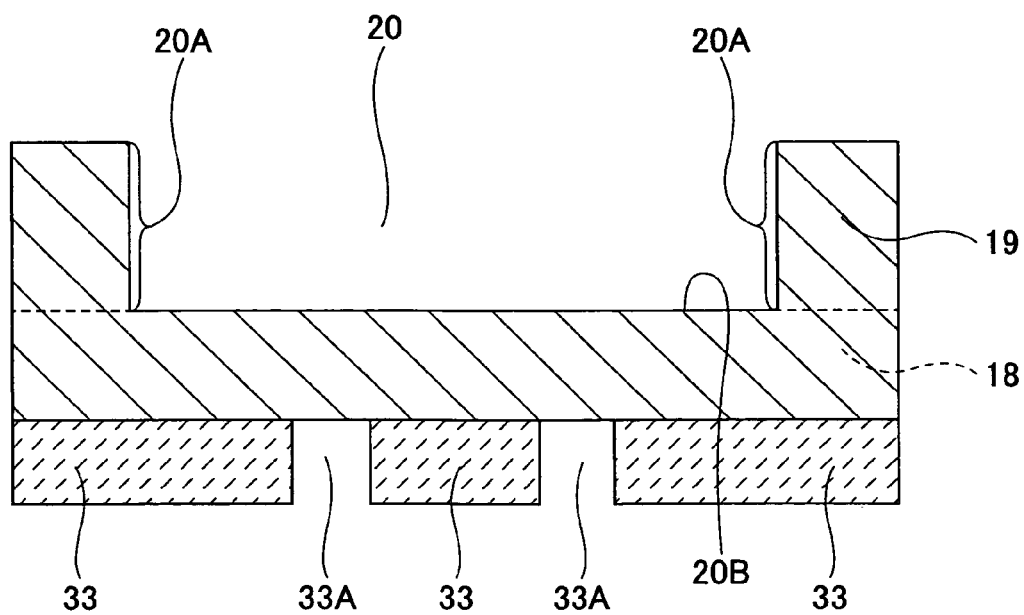

Next, in a process shown in FIG. 5, the resist film 32 is removed. Next, in a process shown in FIG. 6, a resist film 33 is formed on the lower surface of the structure formed by the process shown in FIG. 5 so that opening sections 33A are formed. The opening sections 33A correspond to the positions where the through holes 21 are to be formed; therefore, the lower surfaces of the structure which becomes the plate section 18 are exposed at the opening sections 33A where the through holes 21 are to be formed. The material of the resist film 33 is, for example, a dry film resist.

Figure 7:
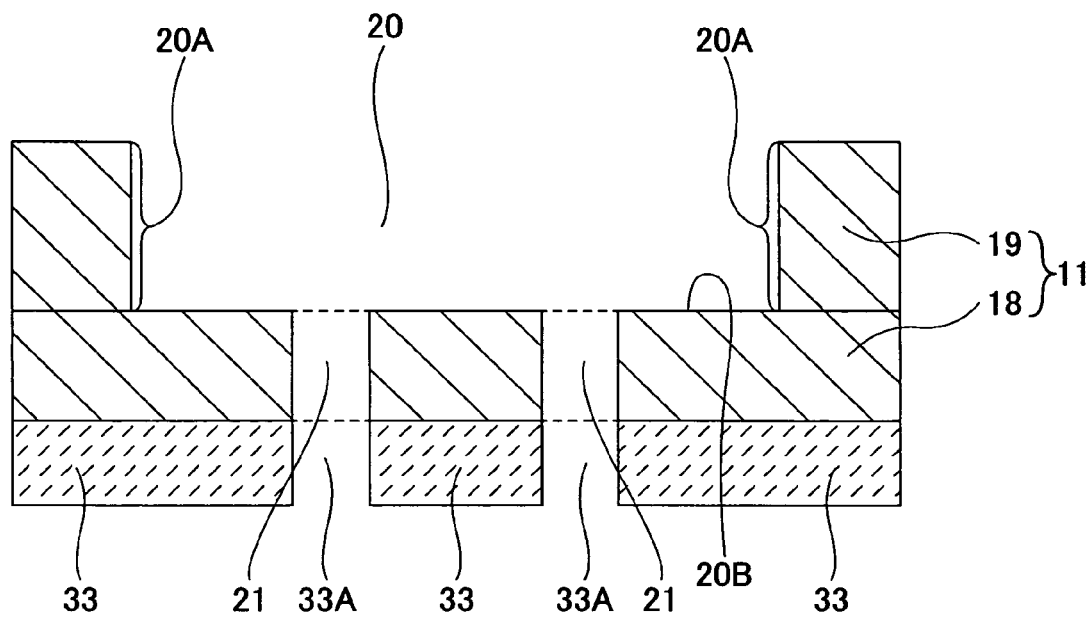

Next, in a process shown in FIG. 7, the through holes 21 are formed by applying anisotropic etching to the structure corresponding to the plate section 18 where the opening sections 33A are formed by using the resist film 33 as a mask. With this, the light emitting element container 11 providing the plate section 18 having the through holes 21 and the frame section 19 is formed. As the anisotropic etching, dry etching can be used.

Figure 8:
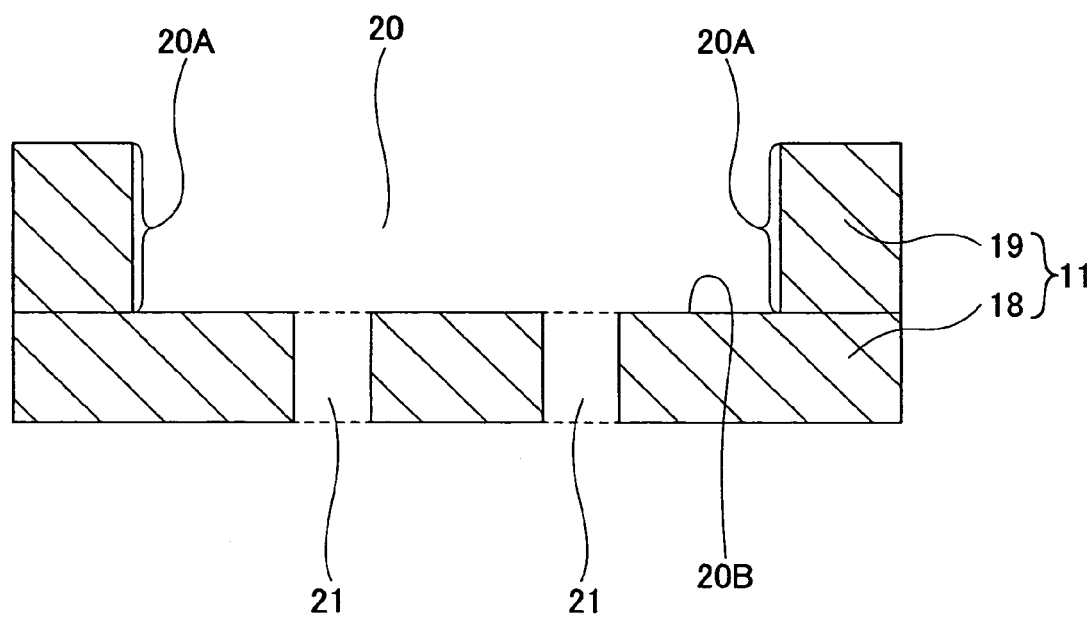

Next, in a process shown in FIG. 8, the resist film 33 is removed. Next, in a process shown in FIG. 9, the insulation film 12 is formed to cover the surface of the light emitting element container 11 including the surfaces of the through holes 21. When the material of the light emitting element container 11 is silicon, the insulation film 12 is formed by thermal oxidization of the light emitting element container 11. As described above, the thickness M2 of the insulation film 12 can be, for example, 1 μm.

Figure 9:
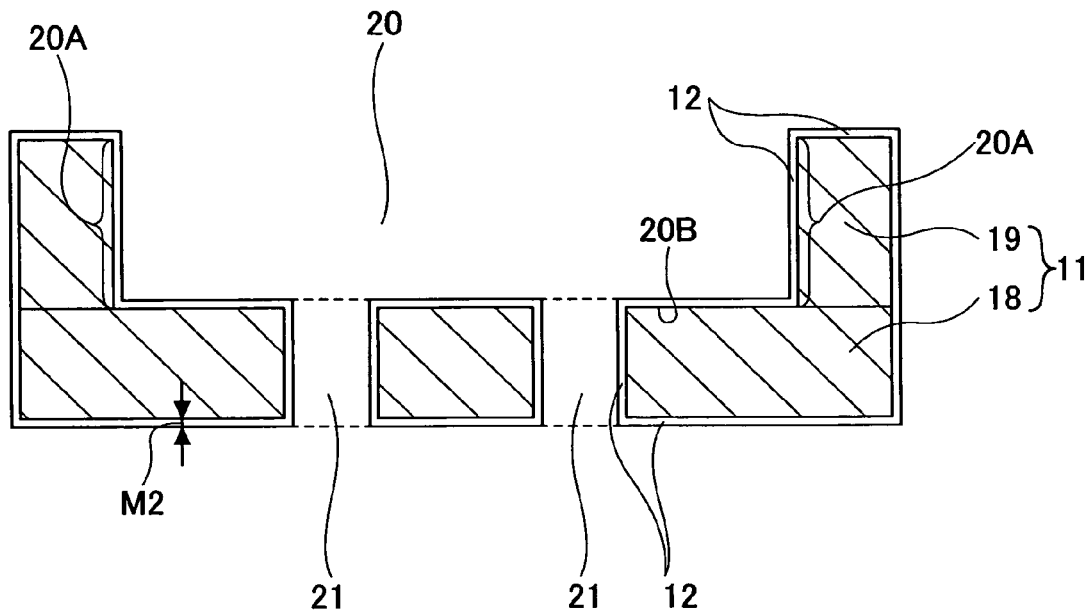
Figure 10:
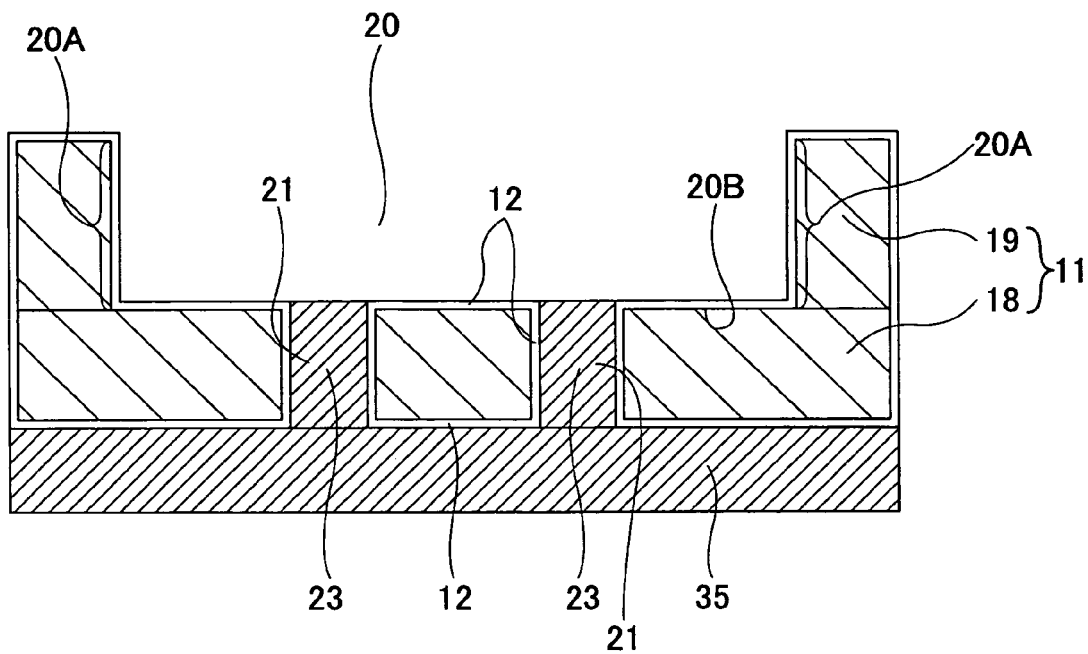

Next, in a process shown in FIG. 10, metal foil 35 is adhered on the lower surface of the structure formed by the process shown in FIG. 9 and an electrolytic plating method is applied to the structure by using the metal foil 35 as a power supply layer. With this, the via wirings 23 are formed by deposit growing of a metal film in an electrolytic solution so that the metal film fills the through holes 21. As the metal foil 35, for example, Cu foil can be used, and as the metal film to fill in the through holes 21, for example, a Cu film can be used.

Figure 21:
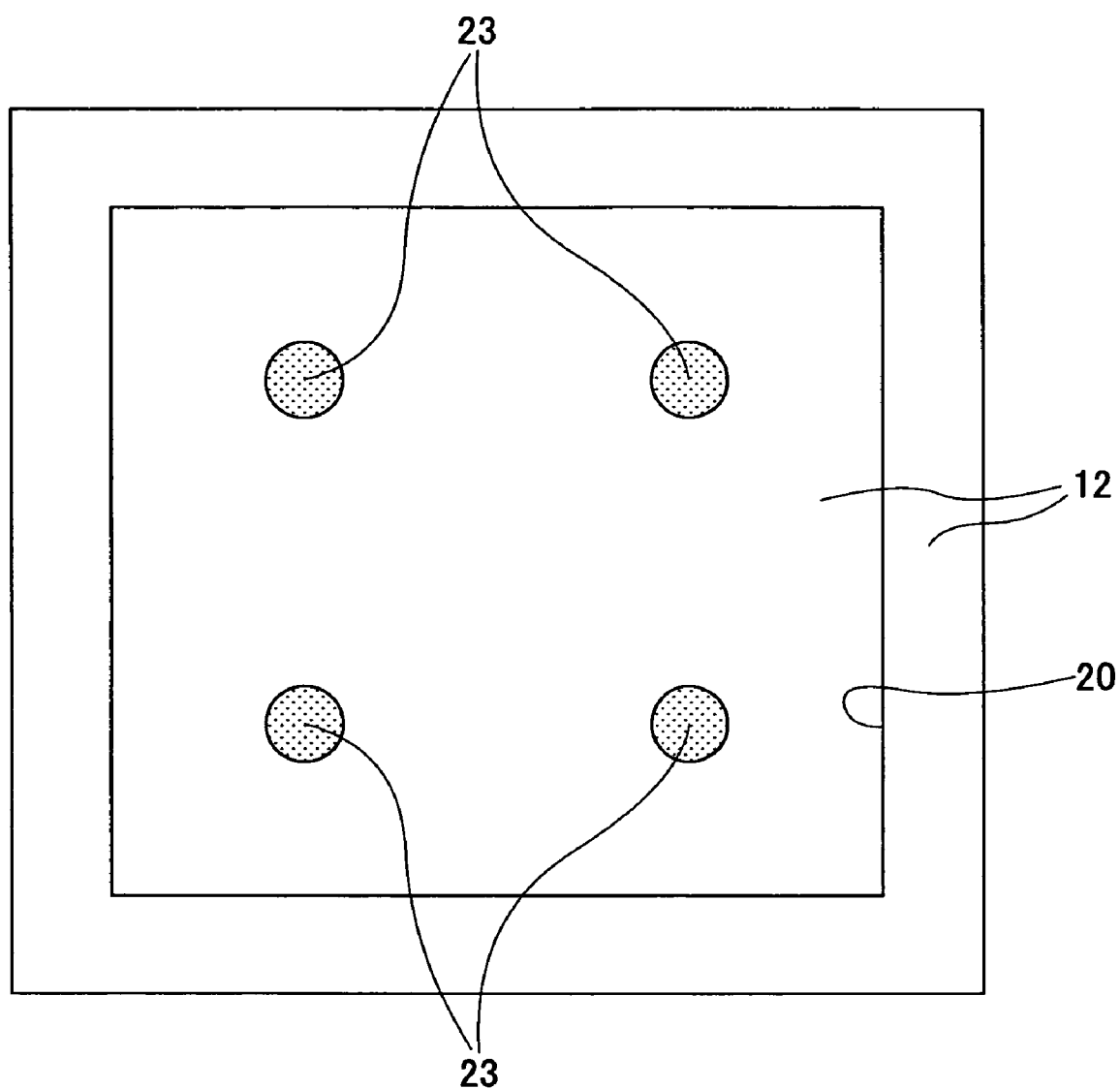
FIG. 21 is a plan view of a structure formed by a process shown in FIG. 10.

FIG. 21 is a plan view of the structure formed by the process shown in FIG. 10. In FIG. 21, four via wirings 23 are shown, that is, two light emitting elements 15 are to be disposed.

Figure 11:
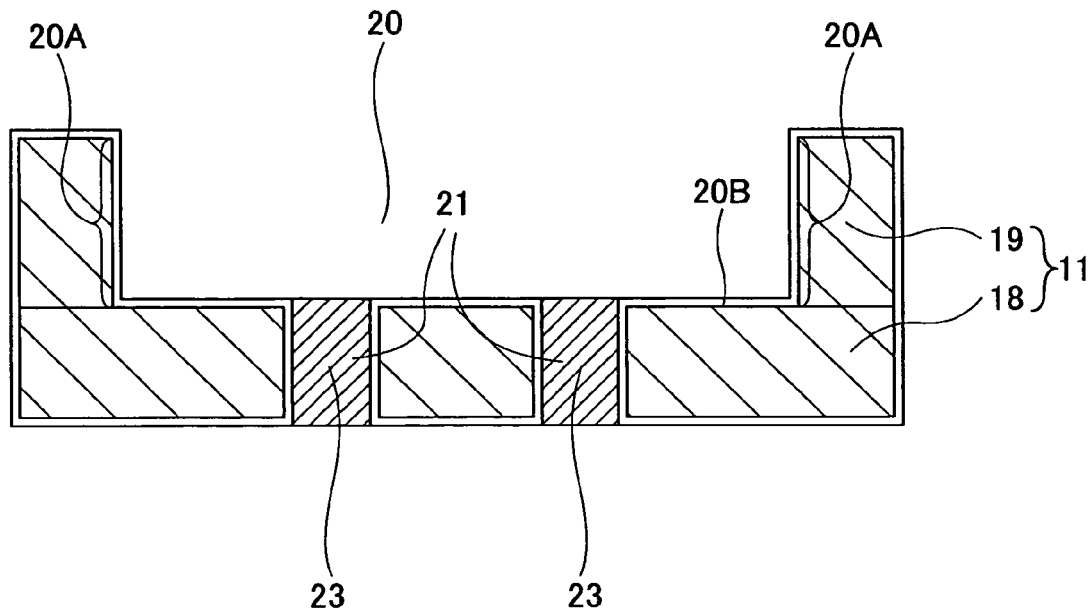
Figure 12:
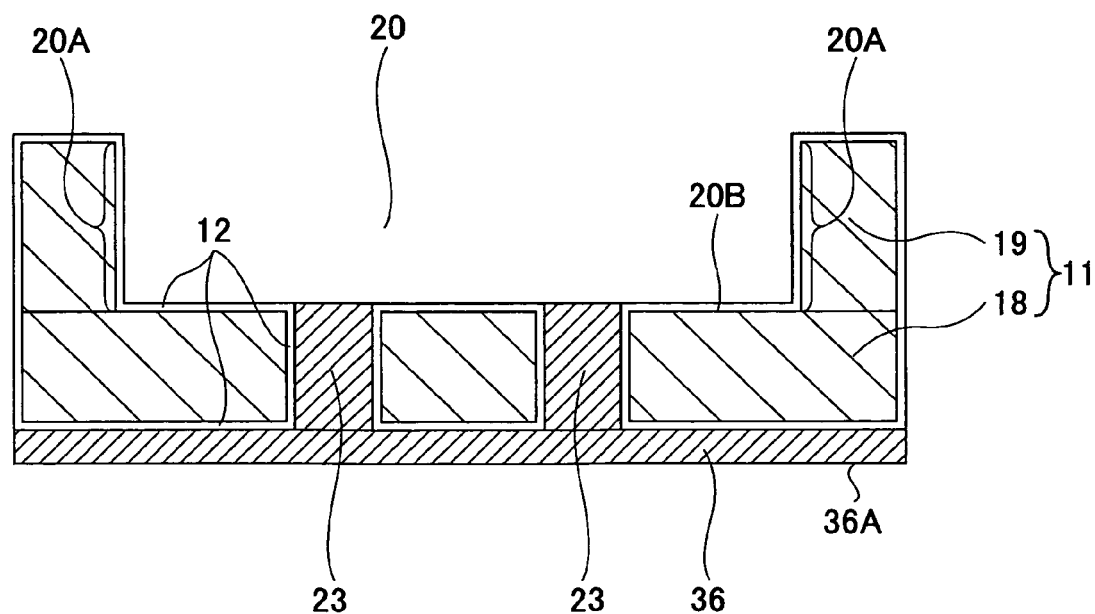

Next, in a process shown in FIG. 11, the metal foil 35 is removed by etching. Next, in a process shown in FIG. 12, a metal film 36 is formed to cover the lower surface of the structure formed by the process shown in FIG. 11. The metal film 36 becomes the wirings 24 by patterning (refer to FIG. 14). The metal film 36 can be formed by, for example, sputtering of a metal. The metal film 36 can be formed by, for example, a Ni/Au stacked film in which a Ni layer and an Au layer are stacked in this order as viewed from the inside.

Figure 13:
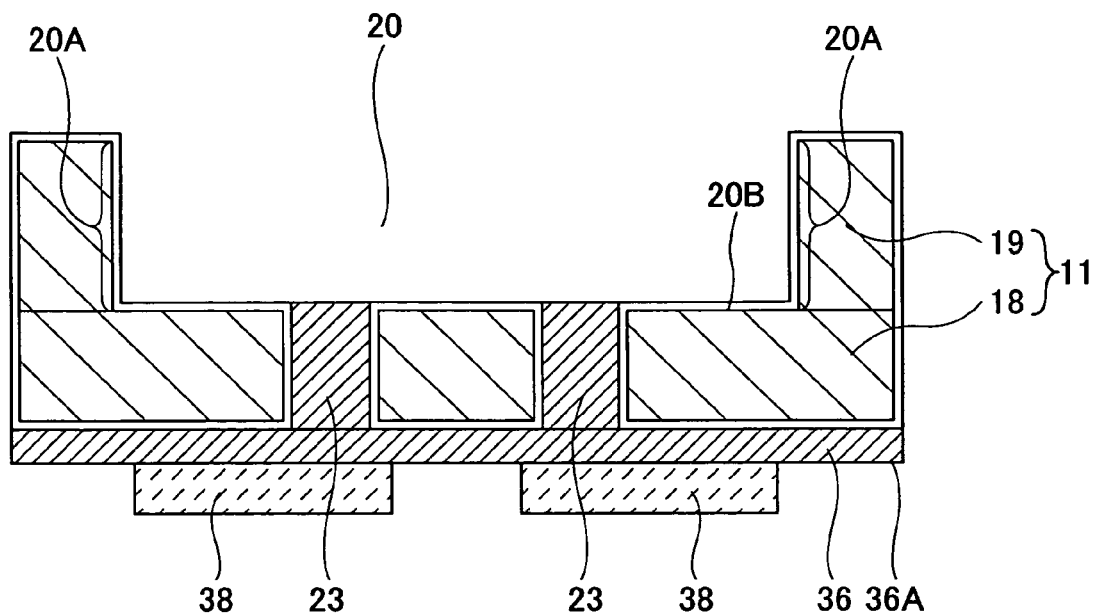
Figure 14:
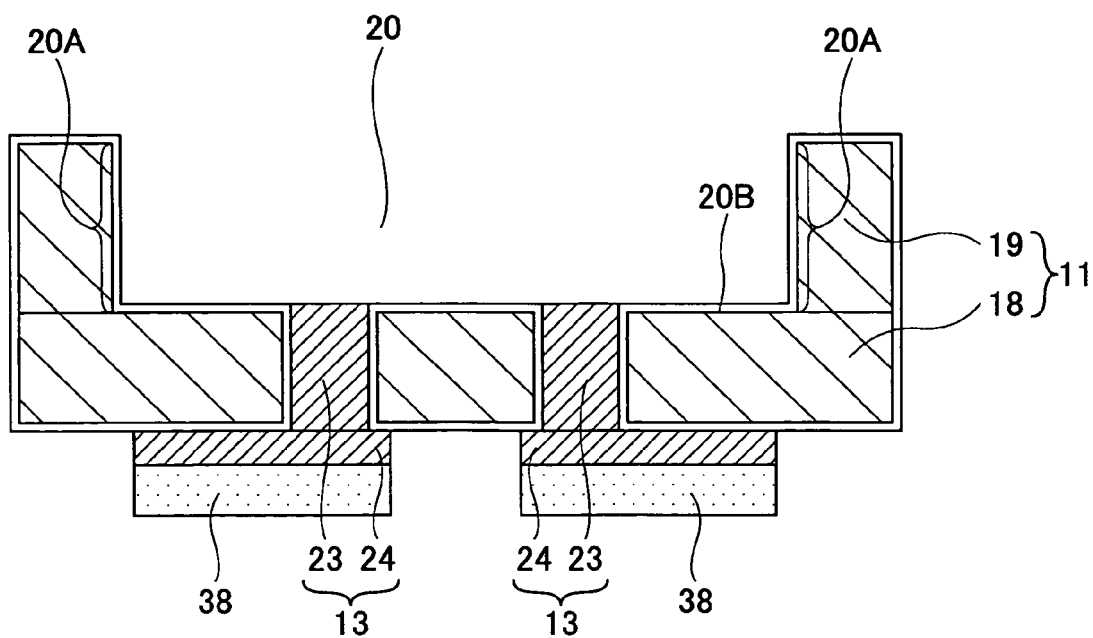
Figure 15:
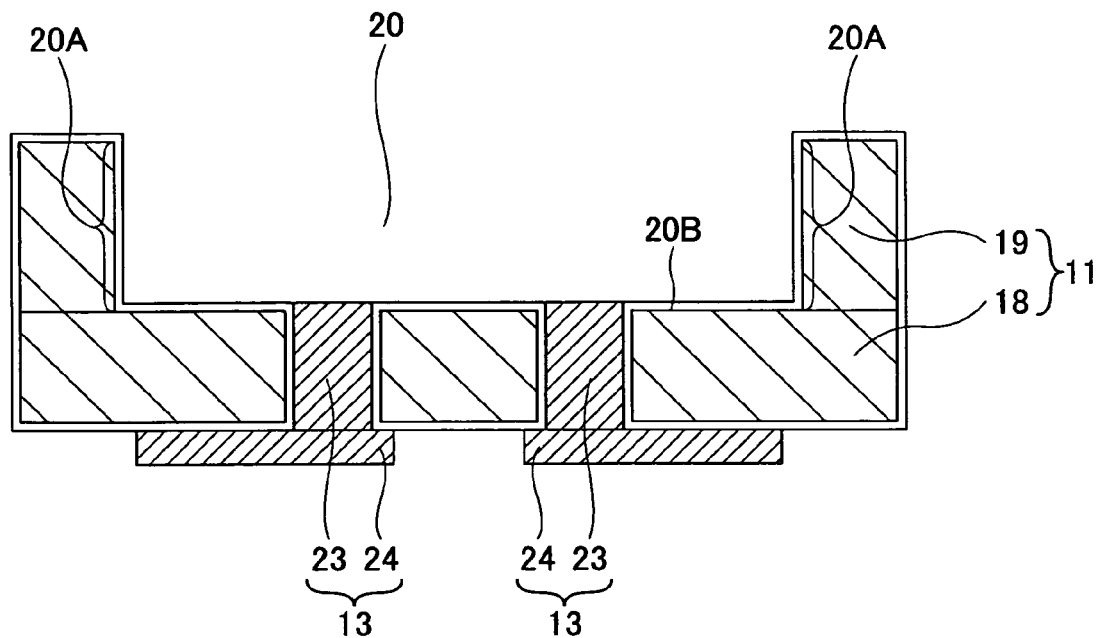

Next, in a process shown in FIG. 13, a resist film 38 which is patterned is formed on a surface 36A of the metal film 36. The resist film 38 is a mask when the metal film 36 is etched by anisotropic etching. Next, in a process shown in FIG. 14, the wirings 24 are formed by anisotropic etching of the metal film 36 until the insulation film 12 is exposed by using the resist film 38 as a mask. With this, the wiring pattern 13 formed of the via wiring 23 and the wiring 24 is formed. Then, in a process shown in FIG. 15, the resist film 38 is removed.

Figure 16:
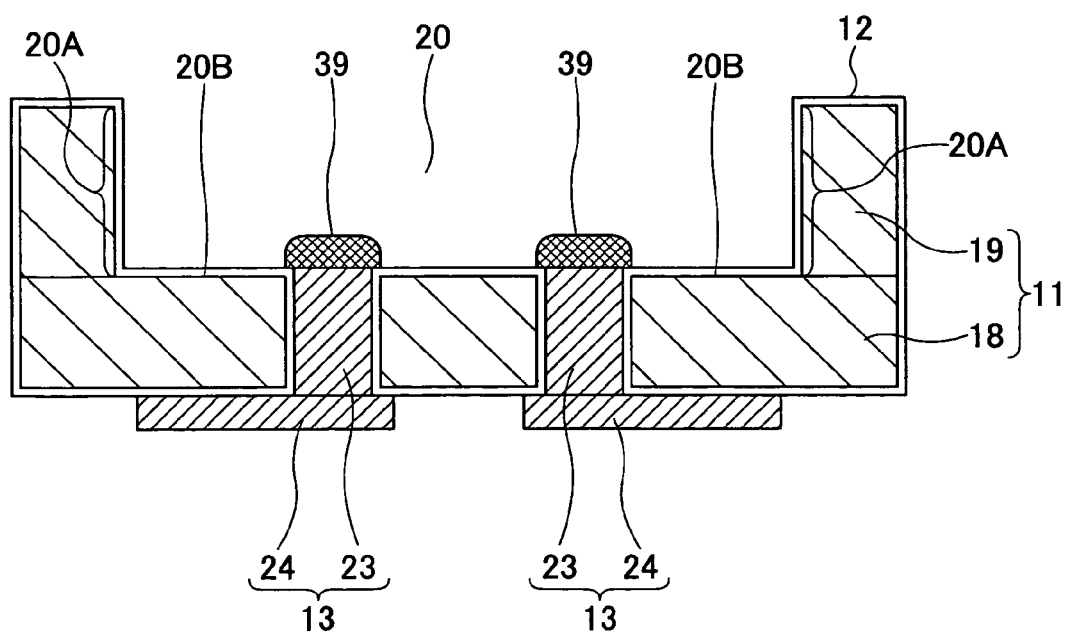

Next, in a process shown in FIG. 16, a water repellent layer 39 is formed to cover the upper surface of the via wiring 23 exposed in the concave section 20.

Figure 22:
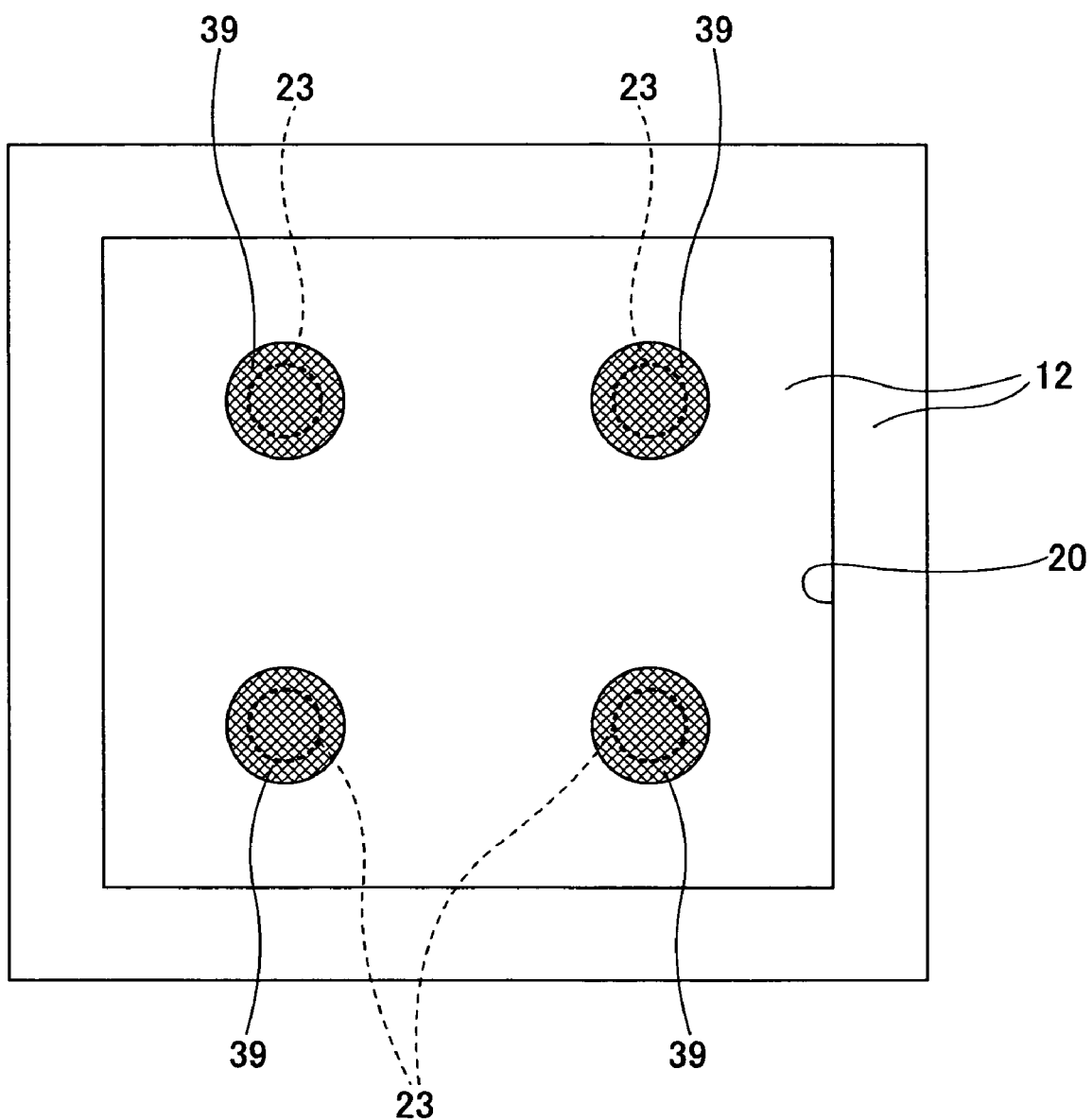
FIG. 22 is a plan view of a structure formed by a process shown in FIG. 16.

FIG. 22 is a plan view of the structure formed by the process shown in FIG. 16. In FIG. 22, four water repellent layers 39 are shown, that is, two light emitting elements 15 are to be disposed.

Figure 17:
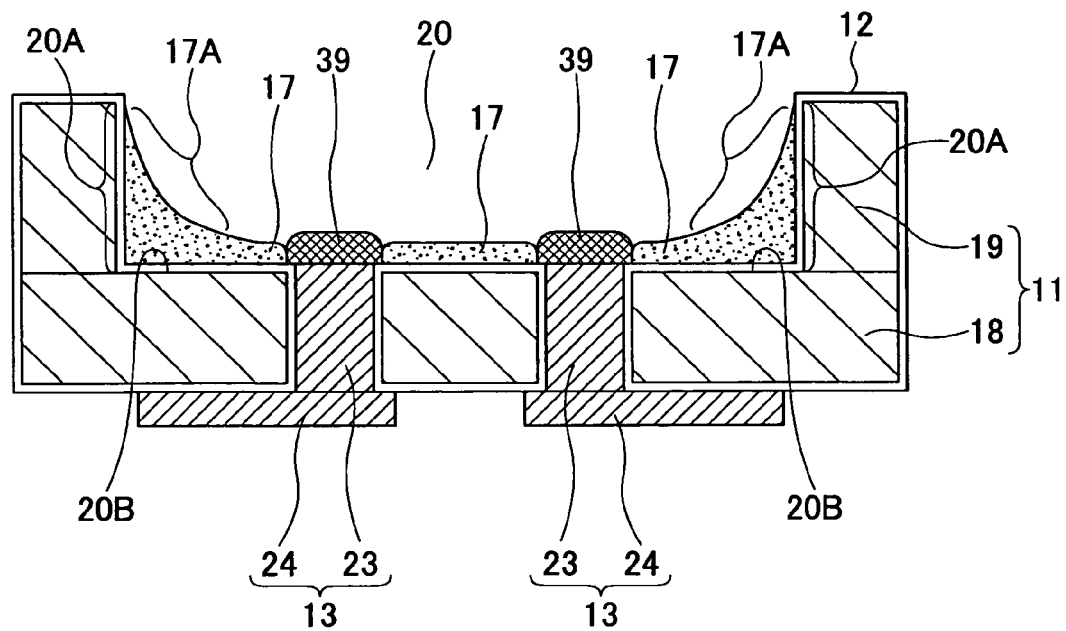

Next, in a process shown in FIG. 17, the conductive paste layer 17 is formed on the side surface 20A and the bottom surface 20B of the concave section 20.

The water repellent layer 39 prevents the via wiring 23 from contacting the conductive paste layer 17 when the slanting surface 17A of the conductive paste layer 17 is formed on the side surface 20A and the bottom surface 20B of the concave section 20. As the material of the water repellent layer 39, for example, SF-COAT (trademark) of SEIMI CHEMICAL Co., Ltd. can be used. In addition, it is preferable that the water repellant layer 39 be formed larger than the size of the upper surface of the via wiring 23 (refer to FIG. 22).

In FIG. 17, as described above, in order to form the conductive paste layer 17, a low viscosity conductive paste in which metal particles are dispersed in a solution is used. When the low viscosity conductive paste is adhered on the side surface 20A and the bottom surface 20B of the concave section 20, the slanting surface 17A of the conductive paste layer 17 is formed by surface tension of the low viscosity conductive paste on the side surface 20A and the bottom surface 20B of the concave section 20.

According to the present embodiment, it is not needed to manufacture the concave section 108 having the metal film 106 shown in FIG. 1 which is difficult to be manufactured. Therefore, the cost of the light emitting device 10 can be decreased.

As described above, as the solution of the conductive paste, for example, water, an organic solvent, or a material in which glycerin is added to the water or the organic solvent can be used. As the organic solvent, for example, alcohol, ether, xylene, or toluene can be used.

In addition, as described above, as the metal particles in the conductive paste, metal particles formed of one or more metals of, for example, Au, Ag, Al, Ni, Pd, and Pt can be used.

As described above, by dispersing one or more metal particles of Au, Ag, Al, Ni, Pd, and Pt in the solution, the conductive paste layer 17 can be used as a reflector for reflecting light emitted from the light emitting element 15.

The average particle diameter of the metal particles is, for example, 10 nm to 30 nm. The volume ratio of the metal particles (=the volume of the metal particles/the volume of the conductive paste) is, for example, 10 wt % to 60 wt %.

The conductive paste layer 17 can be accurately formed on the side surface 20A and the bottom surface 20B of the concave section 20 by a spray coating method, an inkjet method, or a dispensing method.

The conductive paste for the conductive paste layer 17 has low viscosity. The viscosity of the conductive paste is, for example, 1 mPa·s to 200 mPa·s. When the viscosity of the conductive paste is more than 200 mPa·s, the spray coating method cannot be used to form the conductive paste layer 17. When the viscosity of the conductive paste is less than 1 mPa·s, it is difficult to manufacture the conductive paste layer 17 due to a limitation of the manufacturing technology. When the conductive paste layer 17 is formed by the inkjet method, it is preferable that the viscosity of the conductive paste be 5 mPa·s to 30 mPa·s.

Figure 18:
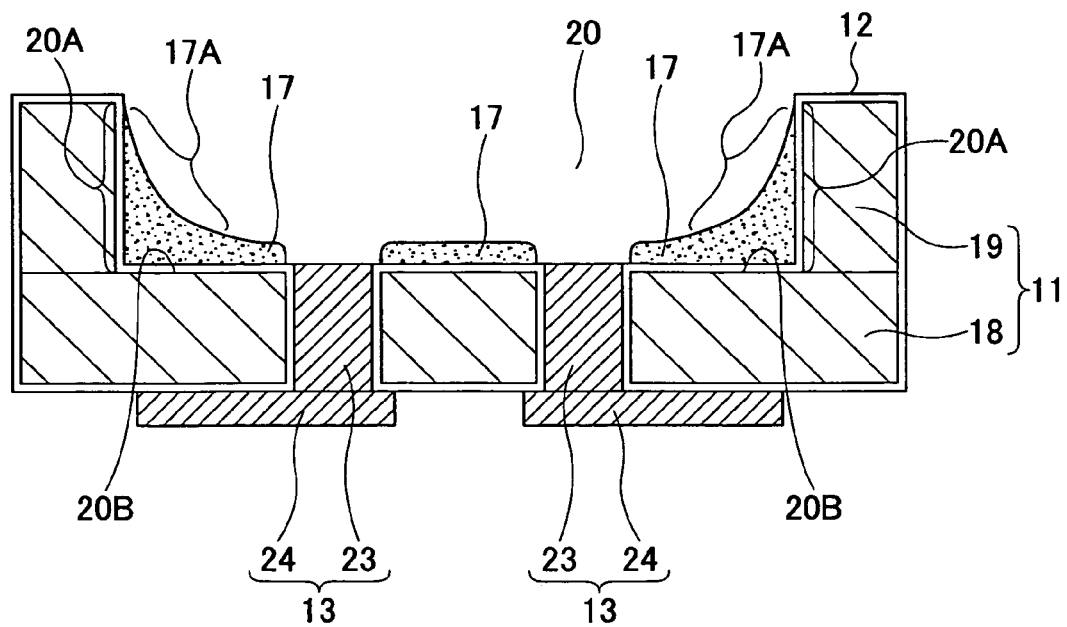

Next, in a process shown in FIG. 18, the water repellent layer 39 is removed. Specifically, the water repellent layer 39 is removed by using, for example, a fluorine-based solvent such as a detergent including CFC 225. With this, the upper surfaces of the via wirings 23 are exposed.

Figure 23:
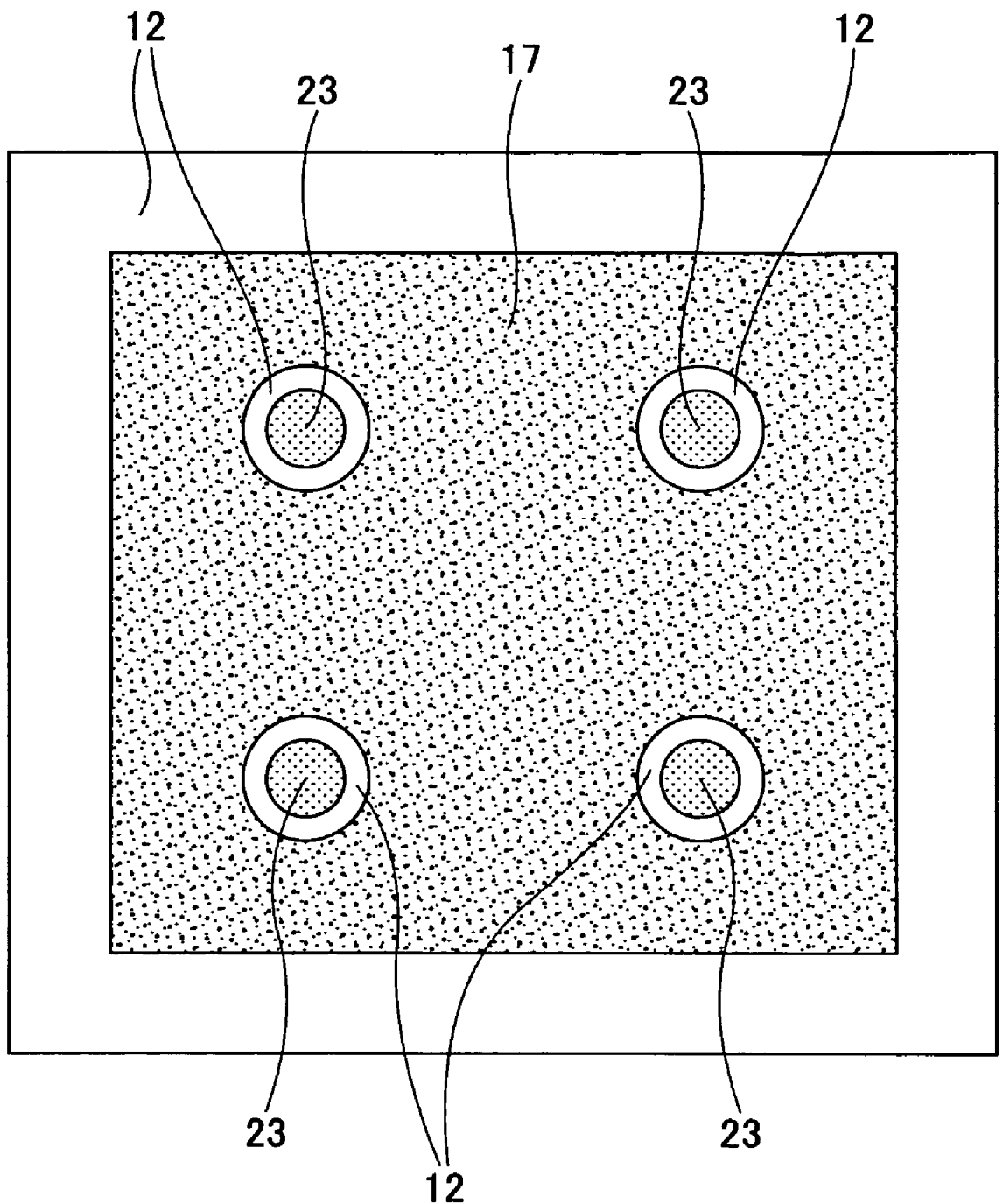
FIG. 23 is a plan view of a structure formed by a process shown in FIG. 18.

FIG. 23 is a plan view of the structure formed by the process shown in FIG. 18. In FIG. 23, four via wirings 23 are shown, that is, two light emitting elements 15 are to be disposed.

Figure 19:
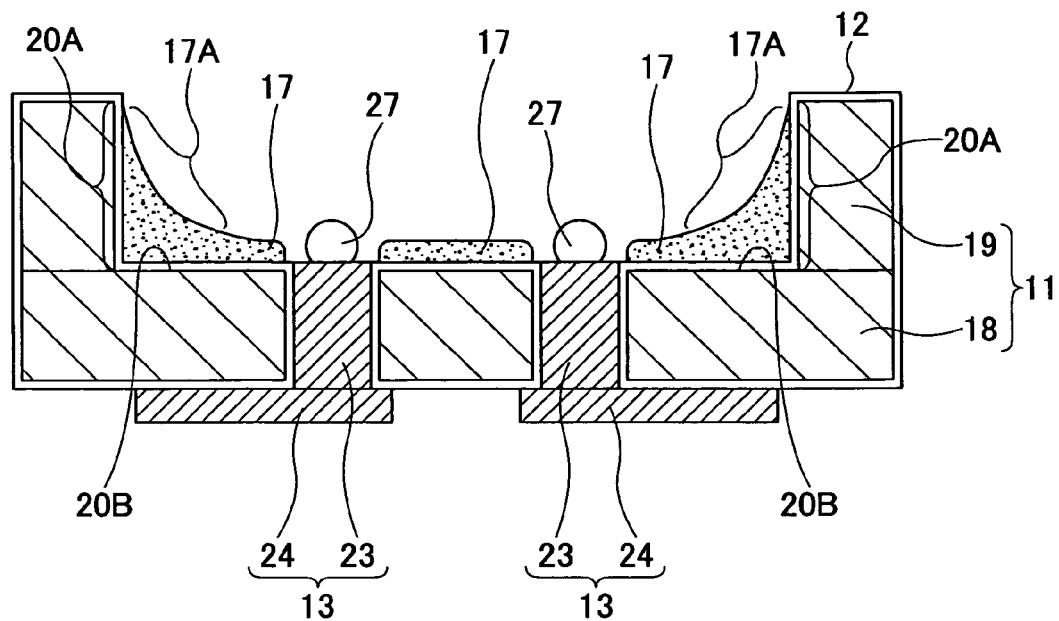

Next, in a process shown in FIG. 19, the bumps 27 are formed on the upper surfaces of the via wirings 23. The bump 27 can be formed of, for example, an Au bump.

Figure 20:
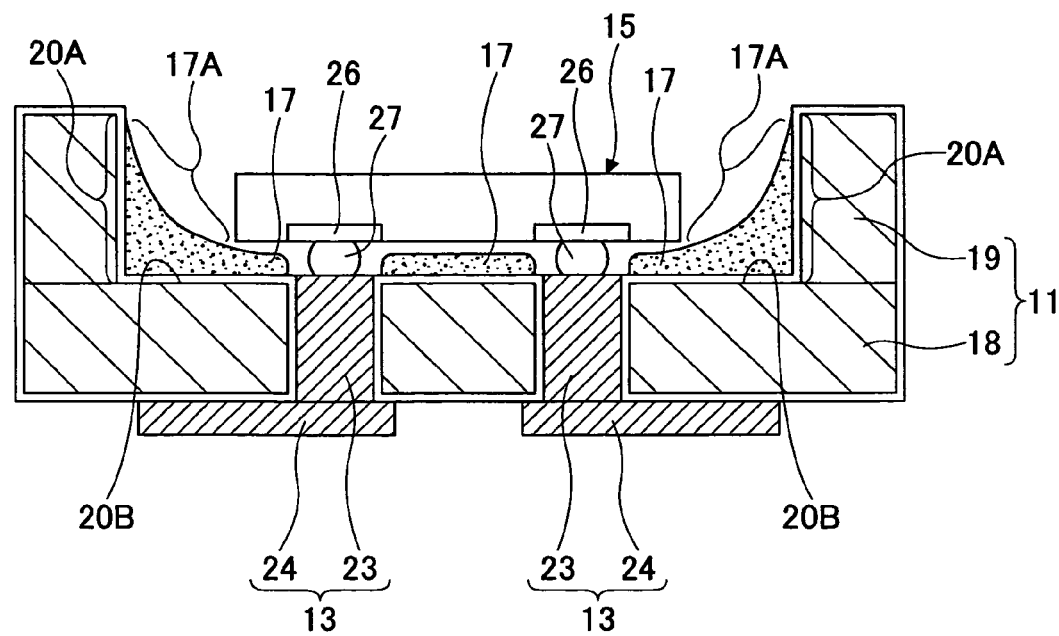

Next, in a process shown in FIG. 20, the light emitting element 15 is electrically connected to the wiring patterns 13 by contacting the bumps 27 which are fused with the corresponding electrodes 26 of the light emitting element 15. With this, the light emitting device 10 is manufactured.

As described above, according to the present embodiment, the low viscosity conductive paste in which metal particles are dispersed in a solution is adhered on the side surface 20A and the bottom surface 20B of the concave section 20. With this, the slanting surface 17A of the conductive paste layer 17 can be formed on the side surface 20A and the bottom surface 20B of the concave section 20 by surface tension of the low viscosity conductive paste. Therefore, it is not necessary to form the concave section 108 having the side surface 108A shown in FIG. 1 which is difficult to manufacture. Accordingly, the light emitting device 10 can be formed at low cost.

Second Embodiment

Figure 24:
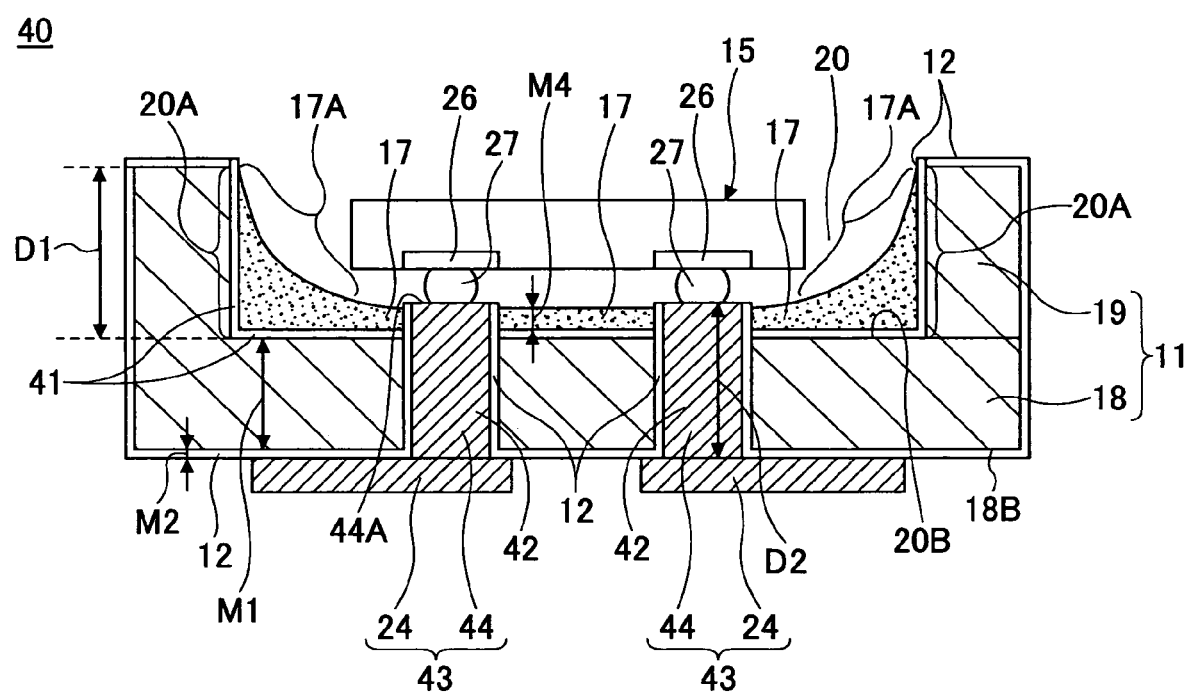
FIG. 24 is a schematic cross-sectional view of a light emitting device according to a second embodiment of the present invention.

Next, referring to the drawings, a second embodiment of the present invention is described. FIG. 24 is a schematic cross-sectional view of a light emitting device 40 according to the second embodiment of the present invention. In the second embodiment, an element that is the same as that in the first embodiment has the same reference number.

Referring to FIG. 24, the light emitting device 40 according to the second embodiment of the present invention is described.

As shown in FIG. 24, in the second embodiment of the present invention, when the light emitting device 40 is compared with the light emitting device 10 in the first embodiment, the light emitting device 40 further includes an insulation film 41, and includes wiring patterns 43 instead of the wiring patterns 13 and through holes 42 instead of the through holes 21.

The insulation film 41 is formed to cover the side surface 20A and the bottom surface 20B of the concave section 20. The insulation film 41 insulates between the light emitting element container 11 and the conductive paste layer 17. The insulation film 41 is formed of, for example, an oxide film. The thickness of the insulation film 41 is, for example, 1 μm.

The wiring pattern 43 provides via wiring 44 and the wiring 24. The via wiring 44 is formed in the through hole 42 on whose surface the insulation film 12 is formed. The upper surface 44A of the via wiring 44 is disposed at the same level of or above the upper surface of the conductive paste layer 17 formed around the via wiring 44. The upper surface 44A of the via wiring 44 is connected to the bump 27 and the lower surface thereof is connected to the wiring 24. The depth D2 of the via wiring 44 is the same as the sum of the thickness M1 of the plate section 18 and the thickness M4 of the conductive paste layer 17 formed around the via wiring 44, or more than the sum of the thickness M1 and the thickness M4.

As described above, the slanting surface 17A of the conductive paste layer 17 is formed on the side surface 20A and the bottom surface 20B of the concave section 20; therefore, the concave section 108 having the metal surface 106 shown in FIG. 1, which surface is difficult to manufacture due to many processes, is not needed. Therefore, the light emitting device 40 can be manufactured at low cost.

FIGS. 25 through 40 are schematic cross-sectional views showing processes for manufacturing the light emitting device 40 according to the second embodiment of the present invention.

Referring to FIGS. 25 through 40, manufacturing processes of the light emitting device 40 according to the second embodiment of the present invention is described.

Figure 25:
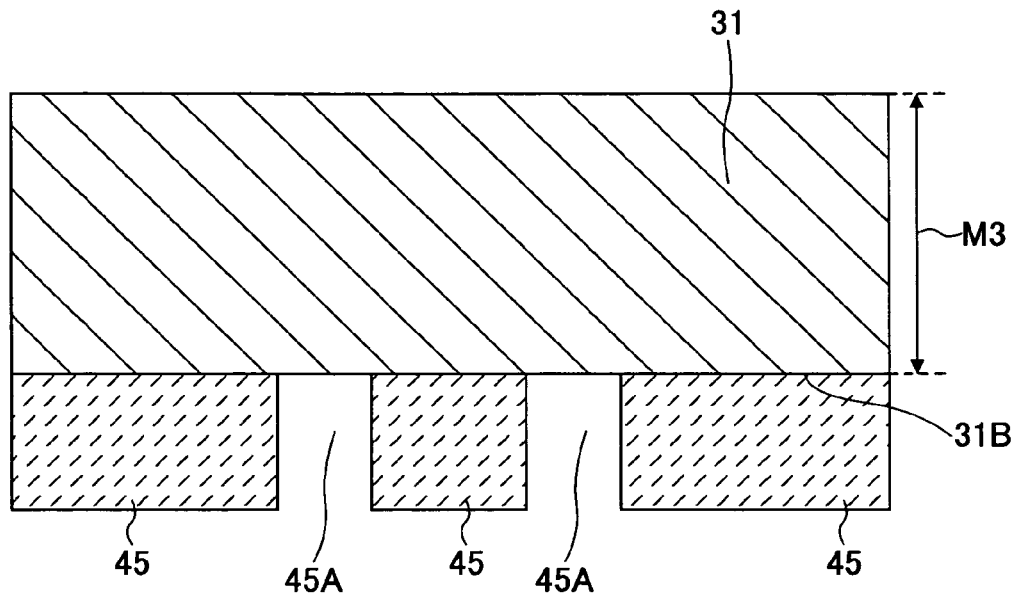
FIGS. 25 through 40 are schematic cross-sectional views showing processes for manufacturing the light emitting device according to the second embodiment of the present invention.

First, in a process shown in FIG. 25, a resist film 45 is formed on the lower surface 31B of the substrate 31 so that opening sections 45A are formed. The opening sections 45A correspond to the position where the through holes 42 are to be formed, and lower surface 31B of the substrate 31 is exposed at the position of the opening section 45A. The material of the substrate 31 is, for example, silicon or glass. The thickness M3 of the substrate 31 is, for example, 400 μm. The material of the resist film 45 is, for example, a dry film resist.

Figure 26:
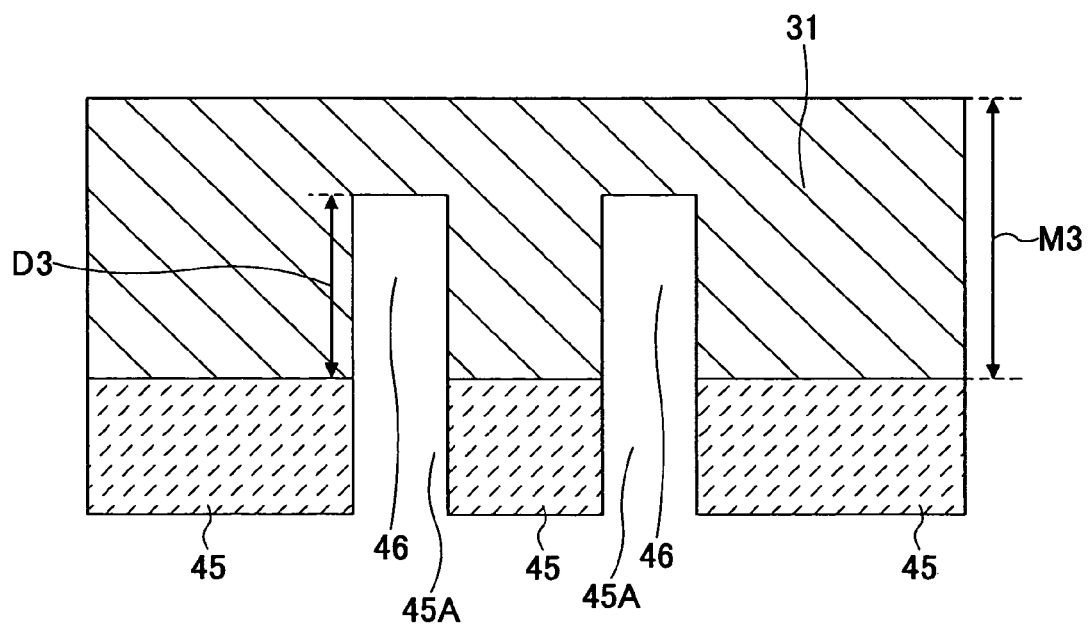

Next, in a process shown in FIG. 26, an opening part 46 is formed by applying anisotropic etching to the substrate 31 by using the resist film 45 as a mask. The opening part 46 later becomes the through hole 42 (refer to FIG. 35). The depth D3 of the opening part 46 is larger than the sum of the thickness M1 of the plate section 18 to be formed and the thickness M4 of the conductive paste layer 17 to be formed around the via wiring 44.

Figure 27:
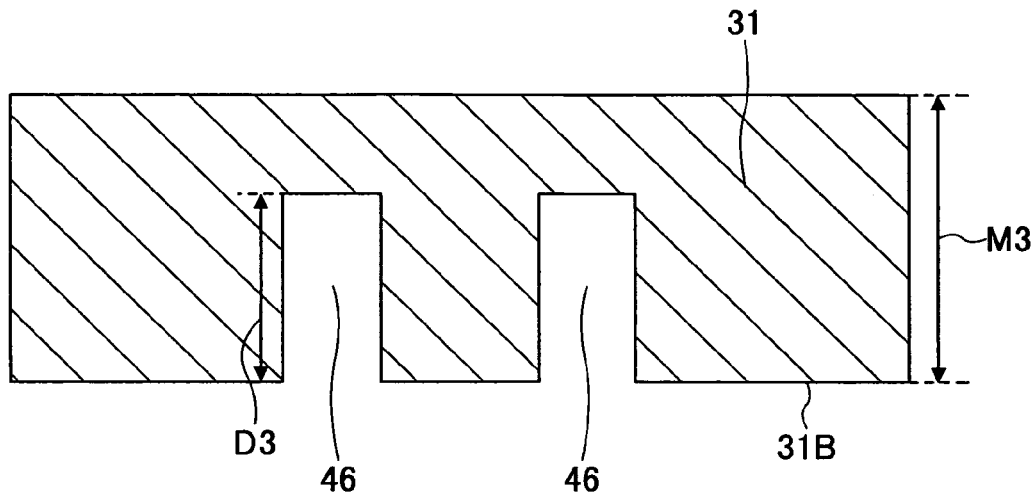

Next, in a process shown in FIG. 27, the resist film 45 is removed. Next, in a process shown in FIG. 28, the insulation film 12 is formed to cover the surface of the structure formed by the process shown in FIG. 27 including the surfaces of the opening parts 46. When the material of the substrate 31 is silicon, the insulation film 12 is formed by thermal oxidization of the structure formed by the process shown in FIG. 27. As described above, the thickness M2 of the insulation film 12 is, for example, 1 μm.

Figure 28:
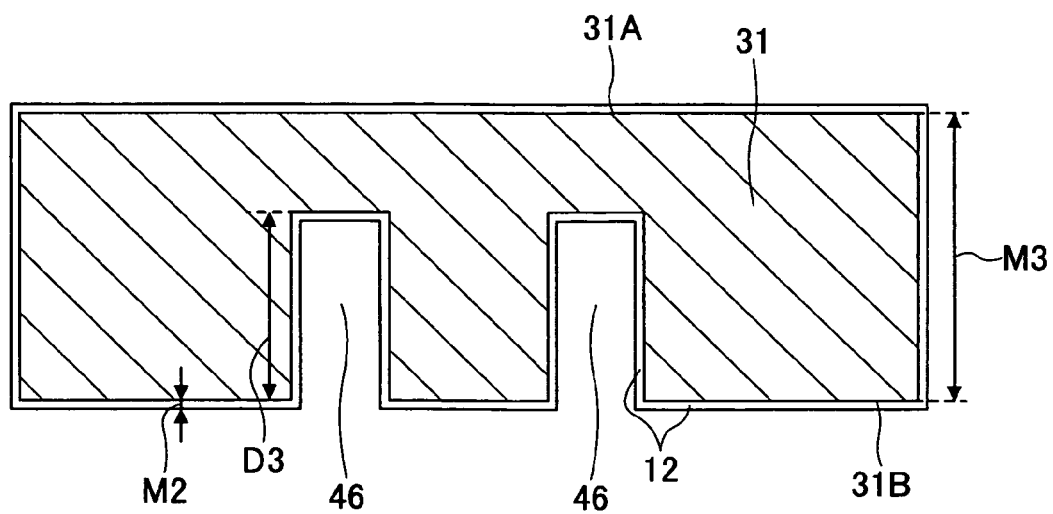
Figure 29:
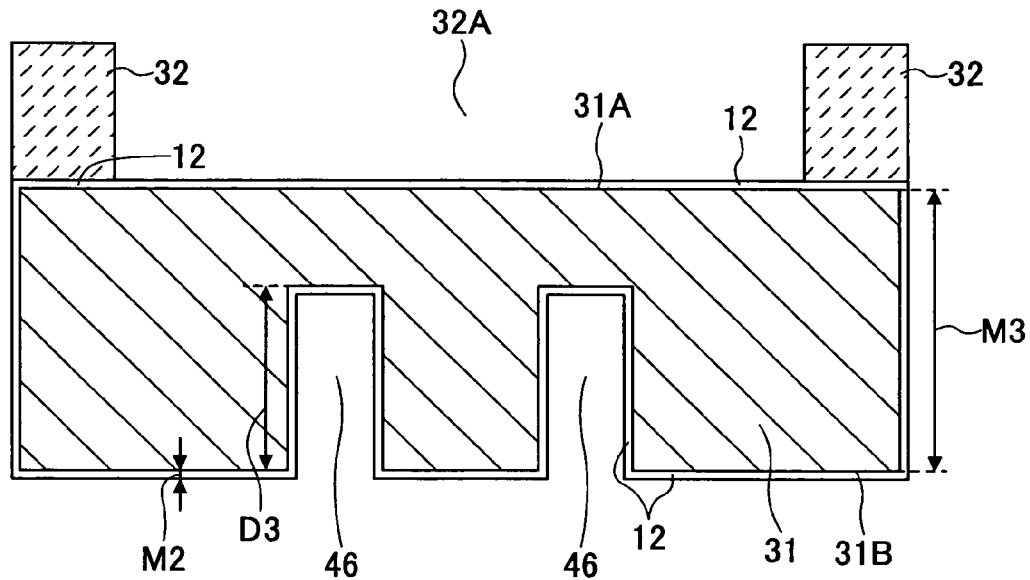

Next, in a process shown in FIG. 29, a resist film 32 is formed on the upper surface of the structure formed by the process shown in FIG. 28 so that an opening section 32A is formed. The opening section 32A is formed at the position corresponds to the concave section 20 to be formed. The resist film 32 is formed of, for example, a dry resist film.

Figure 30:
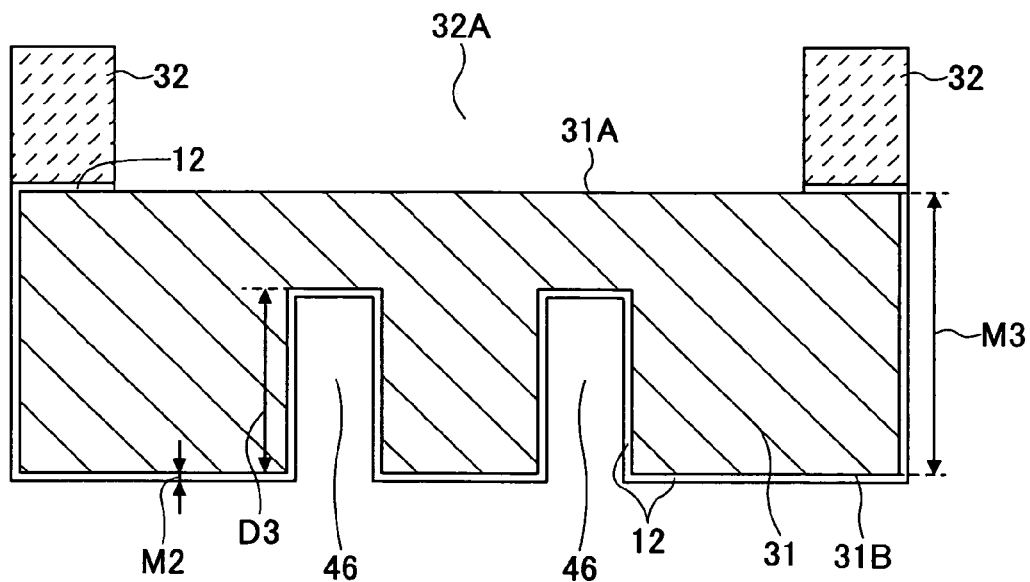
Figure 31:
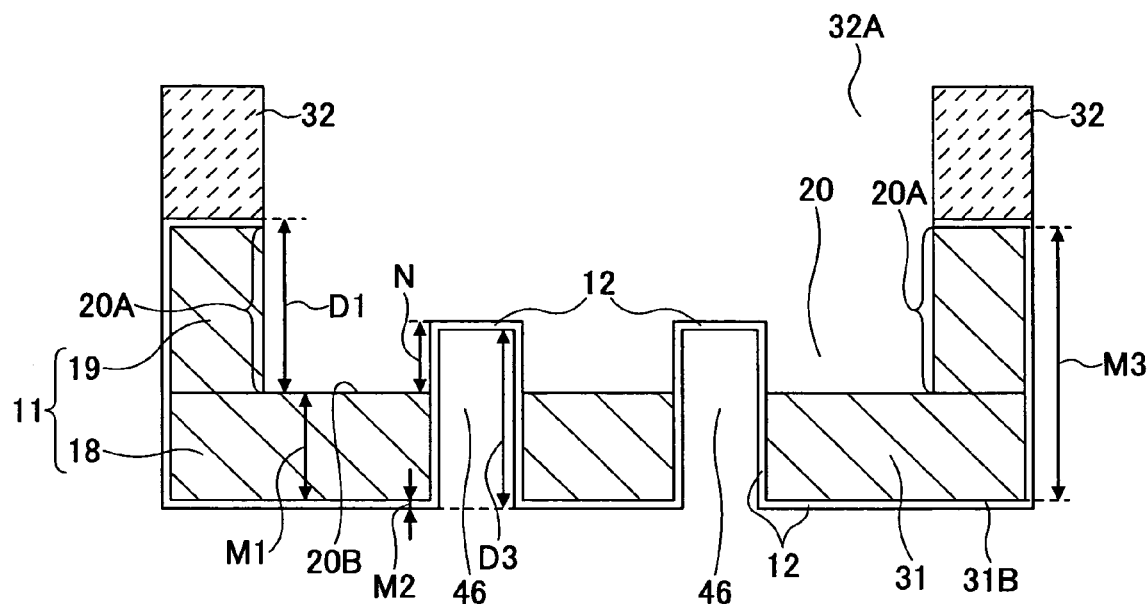

Next, in a process shown in FIG. 30, the insulation film 12 formed on the upper surface 31A of the substrate 31 is removed by applying anisotropic etching to the insulation film 12 by using the resist film 32 as a mask. Next, in a process shown in FIG. 31, the concave section 20 is formed by applying anisotropic etching to the substrate 31 by using the resist film 32 and the insulation film 12 as masks. With this, the light emitting element container 11 having the plate section 18 and the frame section 19 is formed. The side surface 20A is almost orthogonal to the bottom surface 20B in the concave section 20. In the process shown in FIG. 31, the insulation film 12 having a cylinder shape protrudes into the concave section 20.

The thickness M1 of the plate section 18 can be, for example, 200 μm, and the depth D1 of the concave section 20 can be, for example, 200 μm. The protrusion amount N of the insulation film 12 from the bottom surface 20B of the concave section 20 is greater than the sum of the thickness of the insulation film 41 to be formed and the thickness M4 of the conductive paste layer 17 to be formed. As the anisotropic etching, dry etching can be used.

Figure 32:
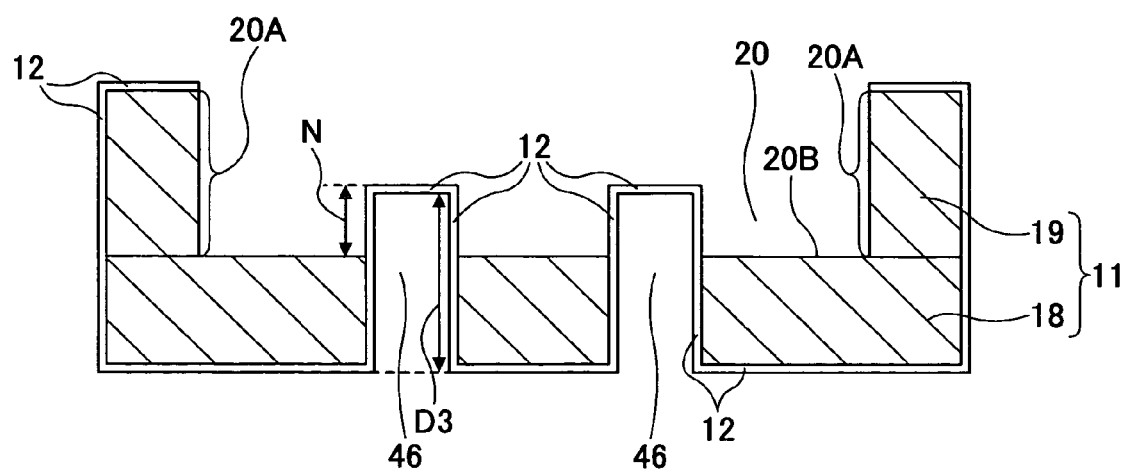
Figure 33:
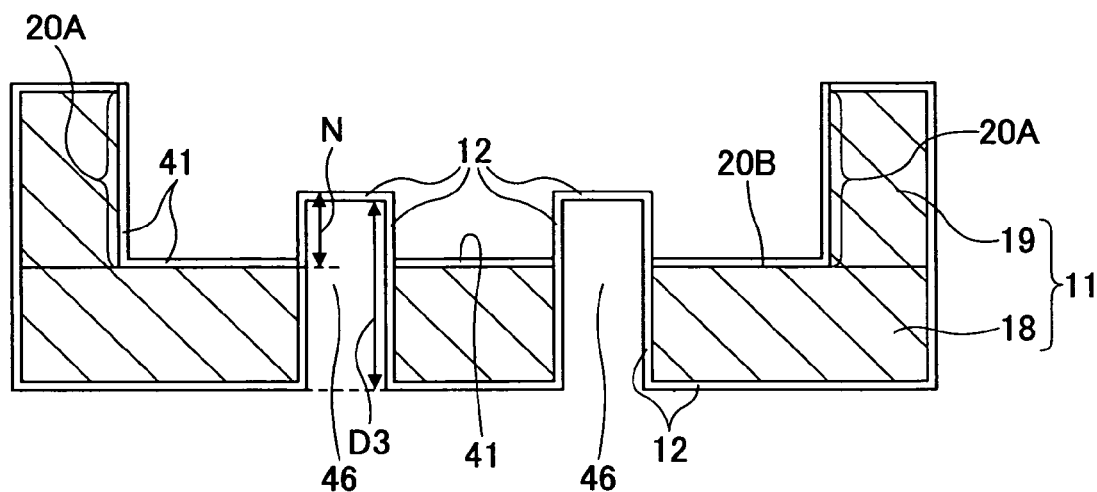

Next, in a process shown in FIG. 32, the resist film 32 is removed. Next, in a process shown in FIG. 33, the insulation film 41 is formed on the side surface 20A and the bottom surface 20B of the concave section 20. When the material of the substrate 31 is silicon, the insulation film 41 is formed by thermal oxidization of the structure formed by the process shown in FIG. 32. That is, an oxide film can be used as the insulation film 41.

Figure 34:
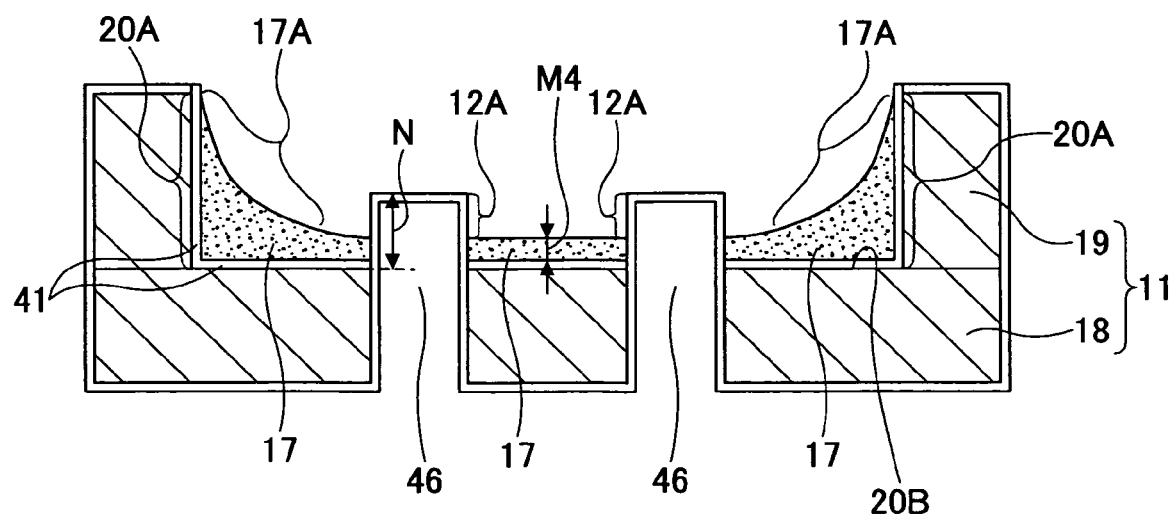

Next, in a process shown in FIG. 34, the conductive paste layer 17 is formed on the side surface 20A and the bottom surface 20B including the center part of the concave section 20 by using a low viscosity conductive paste in which metal particles are dispersed in a solution. When the low viscosity conductive paste is adhered on the side surface 20A and the bottom surface 20B of the concave section 20, the slanting surface 17A of the conductive paste layer 17 is formed by surface tension of the low viscosity conductive paste.

With this, since it is not necessary to form the concave section 108 having the metal film 106 shown in FIG. 1 which is difficult to manufacture, the light emitting device 40 can be formed at low cost.

In addition, since the protrusion amount N of the insulation film 12 from the bottom surface 20B of the concave section 20 is greater than the sum of the thickness of the insulation film 41 and the thickness M4 of the conductive paste layer 17, the upper end of a protrusion section 12A of the insulation film 12 can be exposed in the concave section 20.

Figure 35:
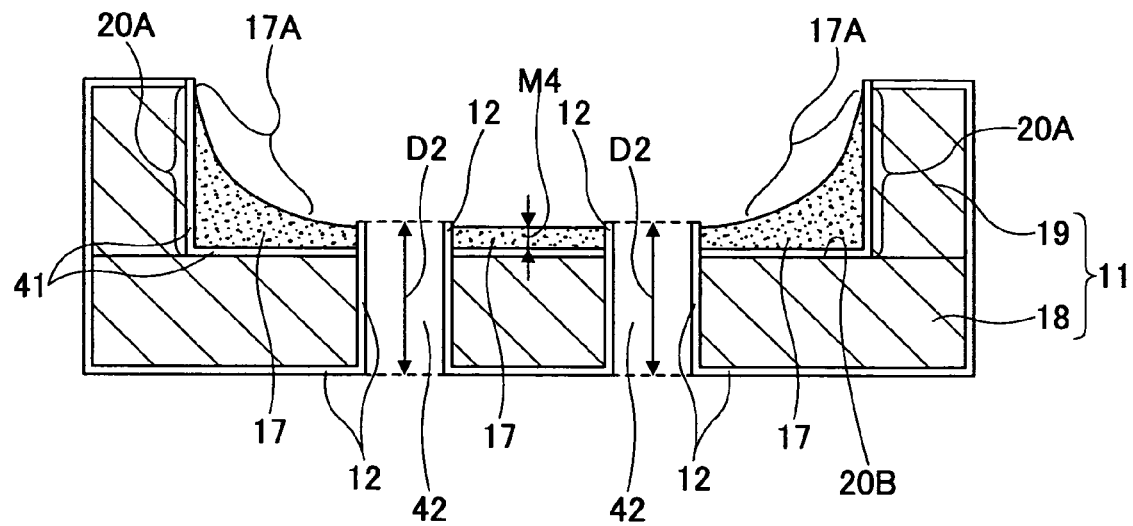

Next, in a process shown in FIG. 35, the through holes 42 having the depth D2 are formed by removing the upper end of the protrusion sections 12A of the insulation film 12. At this time, it is preferable that an opening end of the upper side of each of the through holes 42 be higher than the upper surface of the conductive paste layer 17 formed around the through hole 42.

Figure 36:
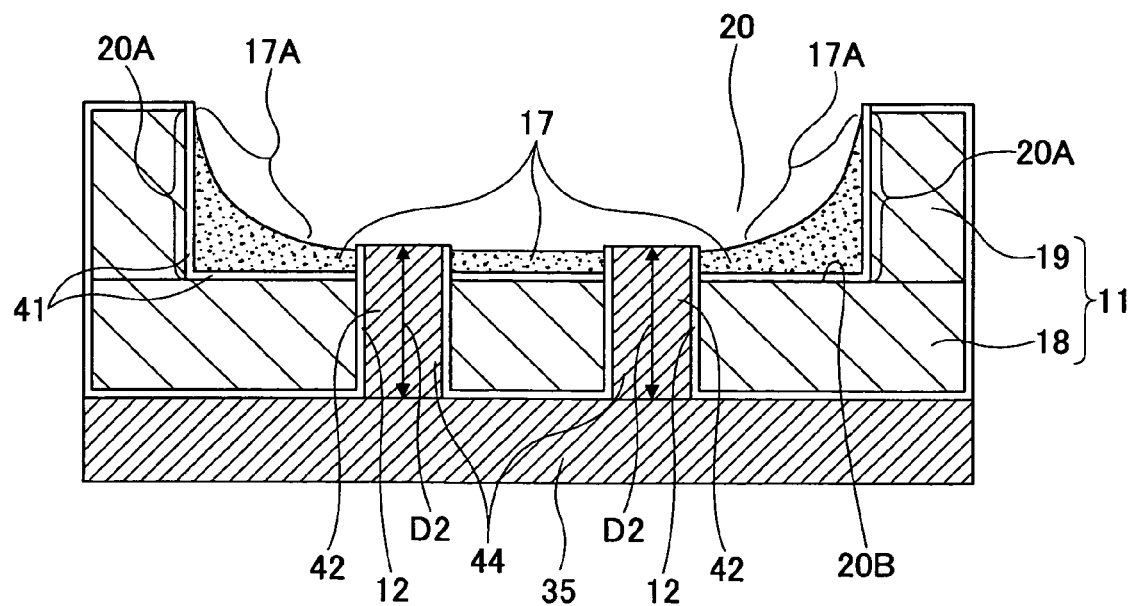

Next, in a process shown in FIG. 36, the metal foil 35 is adhered on the lower surface of the structure formed by the process shown in FIG. 35 and an electrolytic plating method is applied to the structure by using the metal foil 35 as a power supply layer. With this, the via wirings 44 are formed by deposit growing of a metal film in an electrolytic solution so that the metal film fills in the through holes 42. As the metal foil 35, for example, Cu foil can be used, and as the metal film to fill in the through holes 42, for example, a Cu film can be used. The via wiring 44 protrudes from the upper surface of the conductive paste layer 17. The depth D2 of the via wiring 44 is almost the same as the depth D3 of the through hole 42 (refer to FIG. 32).

Figure 37:
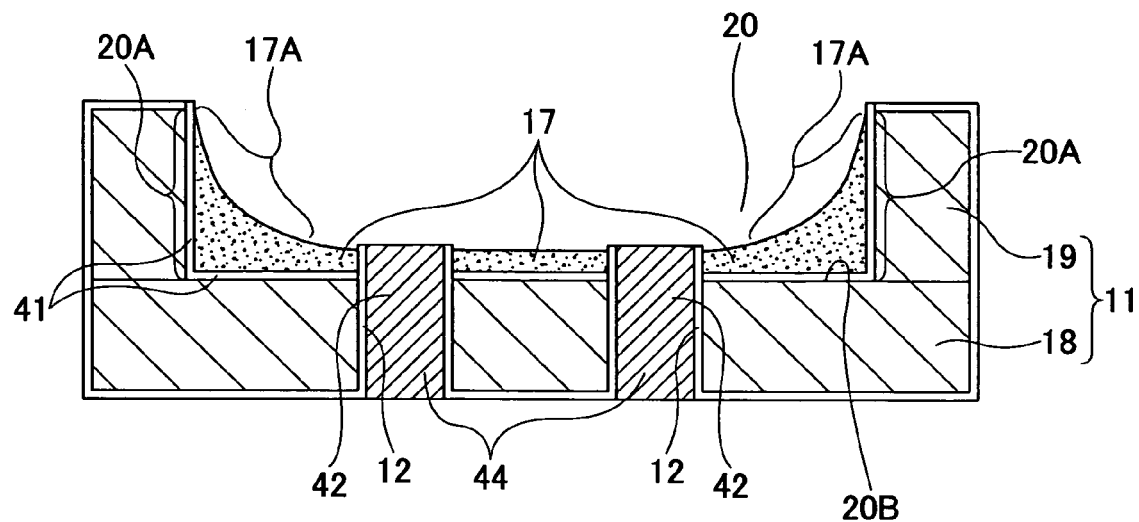
Figure 38:
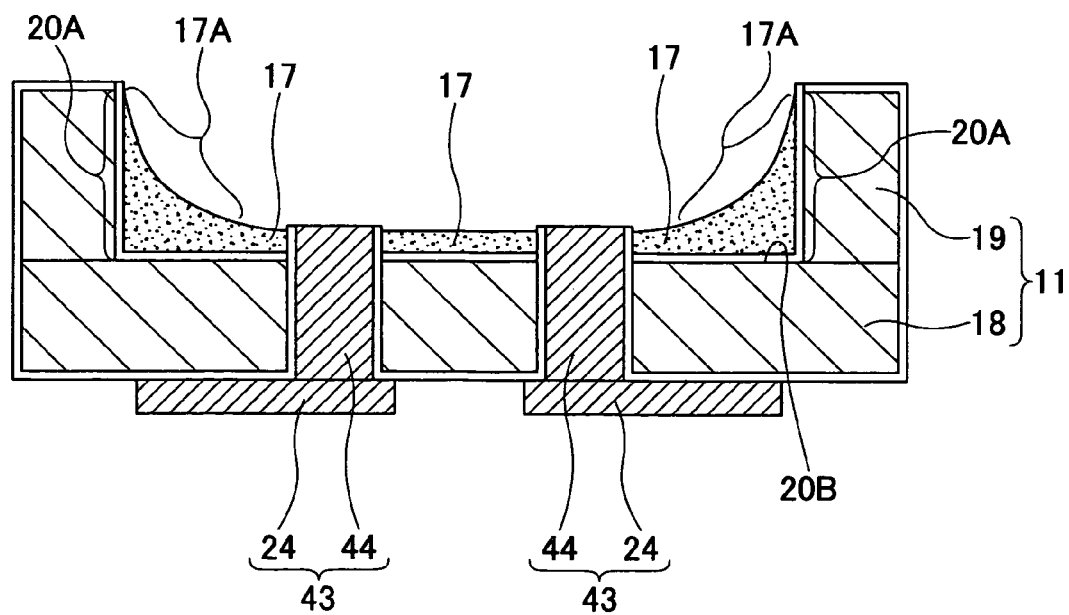

Next, in a process shown in FIG. 37, the metal foil 35 is removed by etching. Next, in a process shown in FIG. 38, by processes similar to those shown in FIGS. 12 through 15, the wirings 24 are formed on the lower surface of the structure formed by the process shown in FIG. 37. With this, the wiring pattern 43 formed of the via wiring 44 and the wiring 24 is formed.

Figure 39:
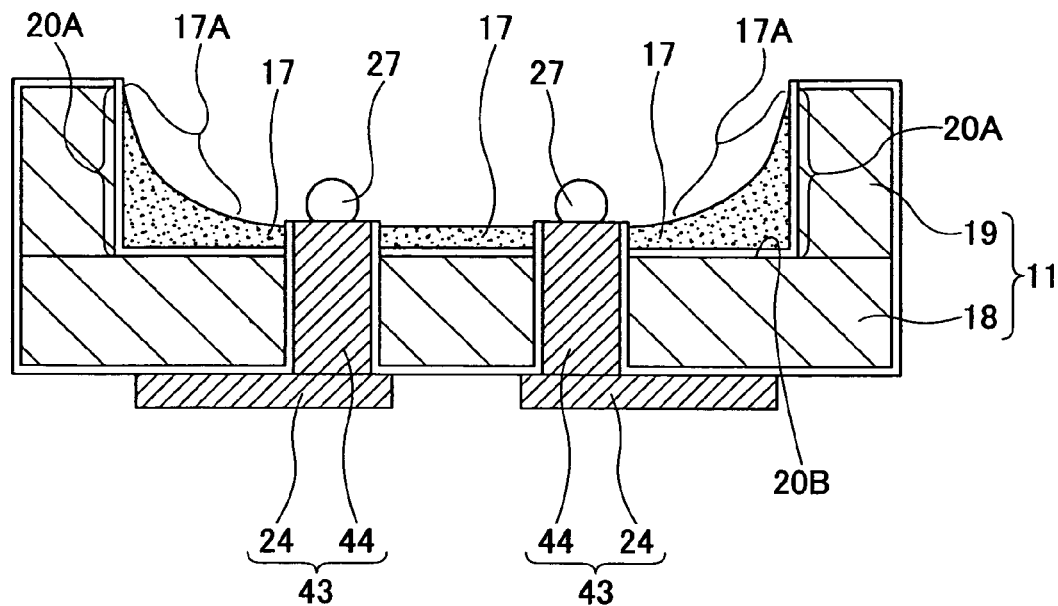

Next, in a process shown in FIG. 39, the bumps 27 are formed on the via wirings 44. The bump 27 can be formed of, for example, an Au bump.

Figure 40:
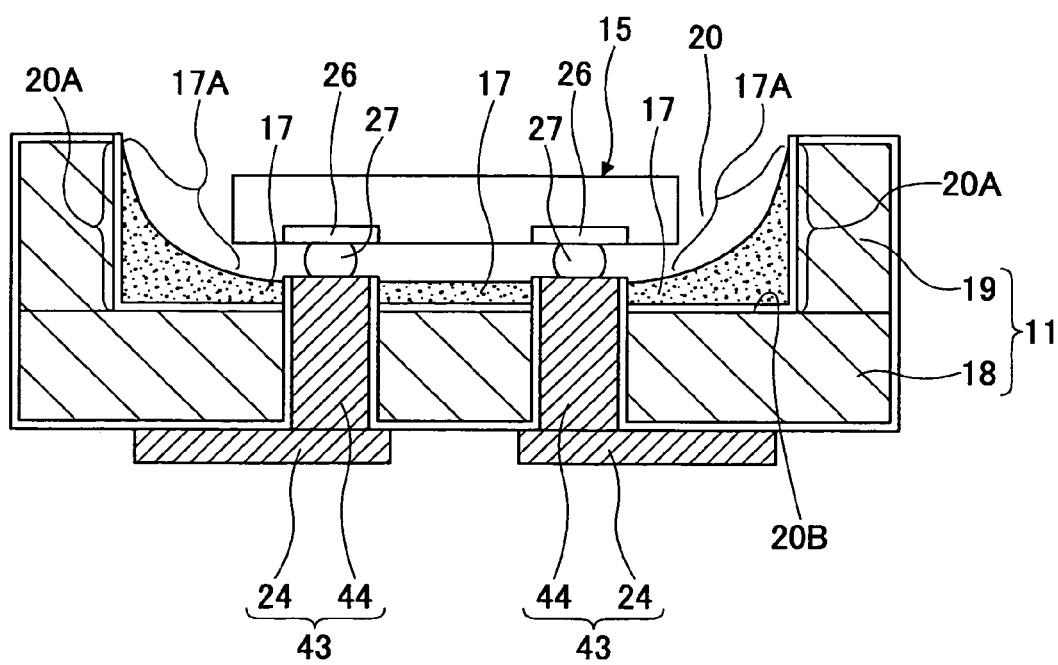

Next, in a process shown in FIG. 40, the light emitting element 15 is electrically connected to the wiring patterns 43 by contacting the bumps 27 which are fused with the corresponding electrodes 27 of the light emitting element 15. With this, the light emitting device 40 is manufactured.

As described above, according to the present embodiment, the low viscosity conductive paste in which metal particles are dispersed in a solution is adhered on the side surface 20A and the bottom surface 20B of the concave section 20. With this, the slanting surface 17A of the conductive paste layer 17 can be formed on the side surface 20A and the bottom surface 20B of the concave section 20 by surface tension of the low viscosity conductive paste. Therefore, it is not necessary to form the concave section 108 having the metal film 106 shown in FIG. 1 which is difficult to manufacture. Accordingly, the light emitting device 40 can be formed at low cost.

Further, the present invention is not limited to these embodiments, but variations and modifications may be made without departing from the scope of the present invention.

The present invention is based on Japanese Priority Patent Application No. 2006-001801, filed on Jan. 6, 2006, with the Japanese Patent Office, the entire contents of which are hereby incorporated herein by reference.

What is claimed is:

1. A light emitting device, comprising:
  a light emitting element;
  a light emitting element container having a concave section for containing the light emitting element and having a plate section;
  electrodes;
  via wiring formed in the plated section; and
  a conductive paste layer formed of a conductive paste in which metal particles are dispersed in a solution; wherein
  the concave section includes a side surface and a bottom surface almost orthogonal to the side surface;
  the conductive paste layer includes a slanting surface on the side surface and the bottom surface;
  the via wiring is electrically connected to the electrode; and
  the conductive paste layer is not formed on an upper surface of the via wiring.

2. The light emitting device as claimed in claim 1, wherein; the metal particles are made of one or more metals of Au, Ag, Ni, Pd, and Pt.

* * * * *